US006768976B1

(12) United States Patent
Homma et al.

(10) Patent No.: US 6,768,976 B1
(45) Date of Patent: Jul. 27, 2004

(54) APPARATUS AND METHOD FOR SIMULATING ELECTRIC CURRENT IN ELECTRONIC APPLIANCES

(75) Inventors: Katsumi Homma, Kanagawa (JP); Makoto Mukai, Kanagawa (JP); Yoshirou Tanaka, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/420,597

(22) Filed: Oct. 19, 1999

(30) Foreign Application Priority Data

Dec. 1, 1998 (JP) .......................................... 10-340906

(51) Int. Cl.[7] .......................... G06F 17/50; G06F 17/10; G06F 7/60; G06F 7/48
(52) U.S. Cl. ................................ 703/14; 703/2; 703/3; 703/4
(58) Field of Search .............................. 703/4, 3, 2, 14; 324/76.11, 76.69

(56) References Cited

U.S. PATENT DOCUMENTS

| | | | | |
|---|---|---|---|---|
| 5,148,379 A | * | 9/1992 | Konno et al. .................. | 716/20 |
| 5,548,293 A | * | 8/1996 | Cohen .................... | 342/357.11 |
| 5,812,434 A | * | 9/1998 | Nagase et al. .................. | 703/2 |
| 6,219,629 B1 | * | 4/2001 | Namiki ........................ | 703/13 |

FOREIGN PATENT DOCUMENTS

JP 5-73527 3/1993

OTHER PUBLICATIONS

H. Lev–Ari, "Lossless Cascade Networks and Stochastic Estimation", IEEE 1998, pp. 17–22.*

J.C. Logan, J.W. Rockaway, "Decomposition of the Moment Method Impedance Matrix into Quasi–Static and Residual Components", IEEE 1989, pp. 291–295.*

* cited by examiner

Primary Examiner—Hugh Jones
Assistant Examiner—Dwin M. Craig
(74) Attorney, Agent, or Firm—Staas & Halsey LLP

(57) ABSTRACT

When an electric current flowing through an electronic appliance is simulated by solving simultaneous linear equations defined depending on an analytic frequency, the simultaneous linear equations are solved in the direct method using a frequency other than the frequencies on both ends of an analytic frequency area as an analysis target, and the simultaneous linear equations are solved in the iterative method while transforming the simultaneous linear equations using the coefficient matrix analyzed in the direct method on the frequencies other than the above described frequency defined as the analysis target.

19 Claims, 26 Drawing Sheets

$$a_{11}x_1 + a_{12}x_2 + \cdots + a_{1n}x_n = b_1$$
$$a_{21}x_1 + a_{22}x_2 + \cdots + a_{2n}x_n = b_2$$
$$a_{31}x_1 + a_{32}x_2 + \cdots + a_{3n}x_n = b_3$$
$$\vdots$$
$$a_{n1}x_1 + a_{n2}x_2 + \cdots + a_{nn}x_n = b_n$$

FIG. 1    PRIOR ART $A = LL^t$ $$L = \begin{bmatrix} \ell_{11} & 0 & \cdot & \cdot & \cdot & \cdot & \cdot & \cdot & 0 \\ \ell_{21} & \ell_{22} & 0 & \cdot & \cdot & \cdot & \cdot & \cdot & 0 \\ \cdot & \cdot & \cdot & \cdot & \cdot & \cdot & \cdot & \cdot & 0 \\ \cdot & \cdot & \cdot & \cdot & \cdot & \cdot & \cdot & \cdot & 0 \\ \ell_{n1} & \ell_{n2} & \ell_{n3} & \cdot & \cdot & \cdot & \cdot & & \ell_{nn} \end{bmatrix}$$

$\ell_{ii} = (a_{ii} - \sum_{k=1}^{i-1} \ell_{ik}^2)^{1/2}$ \qquad (i > 1)

$\ell_{11} = (a_{11})^{1/2}$ $\ell_{ij} = (a_{ij} - \sum_{k=1}^{j-1} \ell_{ik} \ell_{jk}) / \ell_{jj}$ \qquad (i > j)

$\ell_{i1} = a_{i1} / \ell_{11}$

FIG. 2    PRIOR ART $$y_i = (b_i - \sum_{k=1}^{i-1} \ell_{ik} y_k) / \ell_{ii} \qquad (i > 1)$$

$$y_1 = b_1 / \ell_{11}$$

$$x_i = (y_i - \sum_{k=i+1}^{n} \ell_{ik} x_k) / \ell_{ii} \qquad (i < n)$$

$$x_n = y_n / \ell_{nn}$$

FIG. 3    PRIOR ART

ASSUME INITIAL VECTOR x(0); WHERE r(0) = b - Ax(0), p(0) = r(0)

for k=0, 1, ... untill r(k) =0 do $\alpha(k) = <r(k), p(k)>/<p(k), Ap(k)>;$ $x(k+1) = x(k) + \alpha(k) p(k), \quad r(k+1) = r(k) - \alpha(k) Ap(k);$ $\beta(k) = -<r(k+1), Ap(k)>/<p(k), Ap(k)>;$ $p(k+1) = r(k+1) + \beta(k) p(k);$ end x(k) IS SOLUTION OF EQUATION Ax = b WHERE $<x, y> = x_1 y_1 + x_2 y_2 + \cdots + x_n y_n$

FIG. 4  PRIOR ART

ASSUME TRIANGULAR MATRIX C WHERE A ≒ CC$^t$

ASSUME INITIAL VECTOR x(0); WHERE r(0) = b−Ax(0), p(0) = (CC$^t$)$^{-1}$ r(0)

for k=0, 1, . . . untill r(k) =0    do

α(k) =<r(k), p(k)>/<p(k), Ap(k)>;

x(k+1) =x(k) +α(k) p(k),    r(k+1) =r(k) −α(k) Ap(k) ;

β(k) =−<(CC$^t$)$^{-1}$ r(k+1), Ap(k)>/<p(k), Ap(k)> ;

p(k+1) = (CC$^t$)$^{-1}$ r(k+1) +β(k) p(k) ;

end x(k) IS SOLUTION OF EQUATION    Ax = b

WHERE <x,y> = x$_1$y$_1$ + x$_2$y$_2$ + ······ + x$_n$y$_n$

FIG. 5    PRIOR ART

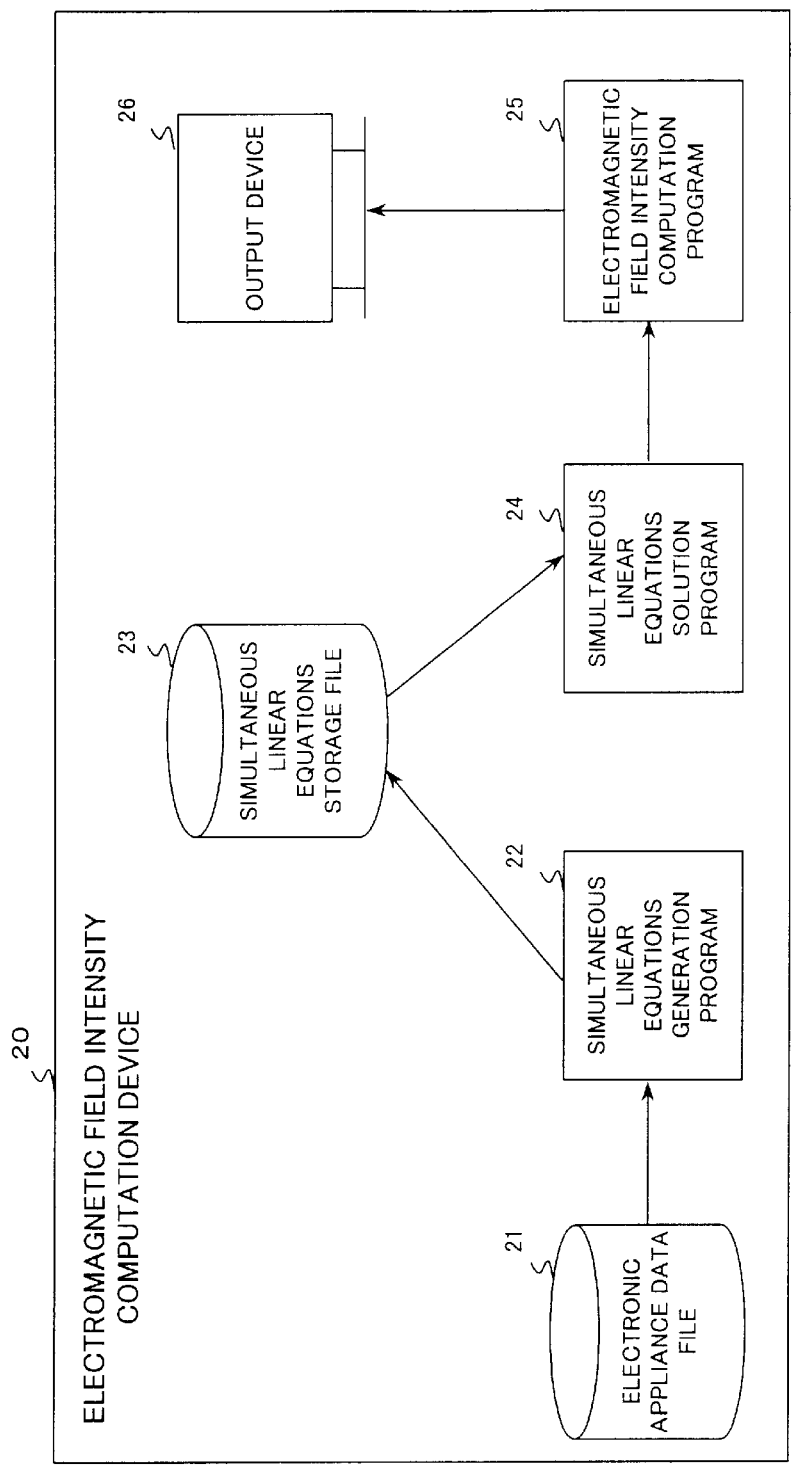
F I G. 7

FIG. 9

$$Z = j\omega \int_s \left[ \frac{\mu}{4\pi} J_1 J_2 \cos\phi \frac{e^{-jkr}}{r} + \frac{1}{4\pi\epsilon} \rho_1 \rho_2 \frac{e^{-jkr}}{r} \right] ds$$

FIG. 11A $$Z_{13} = \frac{j\omega\mu}{4\pi \sin kd_1 \sin kd_3} \int_{t_0}^{t_1} \int_{z_0}^{z_1} [\sin k(z-z_0)\sin k(t-t_0)\cos\phi_1$$

$$-\cos k(z-z_0)\cos k(t-t_0)] \frac{e^{-jkr}}{r} dz\,dt$$

$$Z_{14} = \frac{j\omega\mu}{4\pi \sin kd_1 \sin kd_4} \int_{t_1}^{t_2} \int_{z_0}^{z_1} [\sin k(z-z_0)\sin k(-t+t_2)\cos\phi_2$$

$$+\cos k(z-z_0)\cos(-t+t_2)] \frac{e^{-jkr}}{r} dz\,dt$$

FIG. 11B

| | |
|---|---|
| MONO-POLE POSITION END | $z_0, z_1$ |
| DIRECTION OF ELECTRIC CURRENT | $z_0 \rightarrow z_1$ |
| WAVE SOURCE PSITION | $z'$ |
| MONO-POLE LENGTH | $d\ (= z_1 - z_0)$ |
| DISTANCE BETWEEN WAVE SOURCE AND OBSERVATION POINT | $r = \sqrt{\rho^2 + (z-z')^2}$ |
| | $r_0 = \sqrt{\rho^2 + (z-z_0)^2}$ |
| | $r_1 = \sqrt{\rho^2 + (z-z_1)^2}$ |
| DISTRIBUTION OF ELECTRIC CURRENT | $J^+ = \dfrac{\sin k(d-z'+z_0)}{\sin kd}$ |
| | $J^- = \dfrac{\sin k(d+z'-z_1)}{\sin kd}$ |

$$Ez^+(z,\rho) = -\frac{j\omega\mu}{4\pi k \sin kd} \left[ \frac{\exp(-jkr_1)}{r_1} - \cos kd \frac{\exp(-jkr_0)}{r_0} \right]$$

$$-j(z-z_0)\sin kd \frac{\exp(-jkr_0)}{r_0^2} - \frac{z-z_0}{k}\sin kd \left[ -\frac{\exp(-jkr_0)}{r_0^3} \right]$$

$$E\rho^+(z,\rho) = -\frac{j\omega\mu}{4\pi k \rho \sin kd} \left[ -(z-z_1)\frac{\exp(-jkr_1)}{r_1} + (z-z_0)\cos kd \frac{\exp(-jkr_0)}{r_0} \right]$$

$$+j(z-z_0)^2 \sin kd \frac{\exp(-jkr_0)}{r_0^2} - \frac{\rho^2}{k}\sin kd \left[ -\frac{\exp(-jkr_0)}{r_0^3} \right]$$

FIG. 13

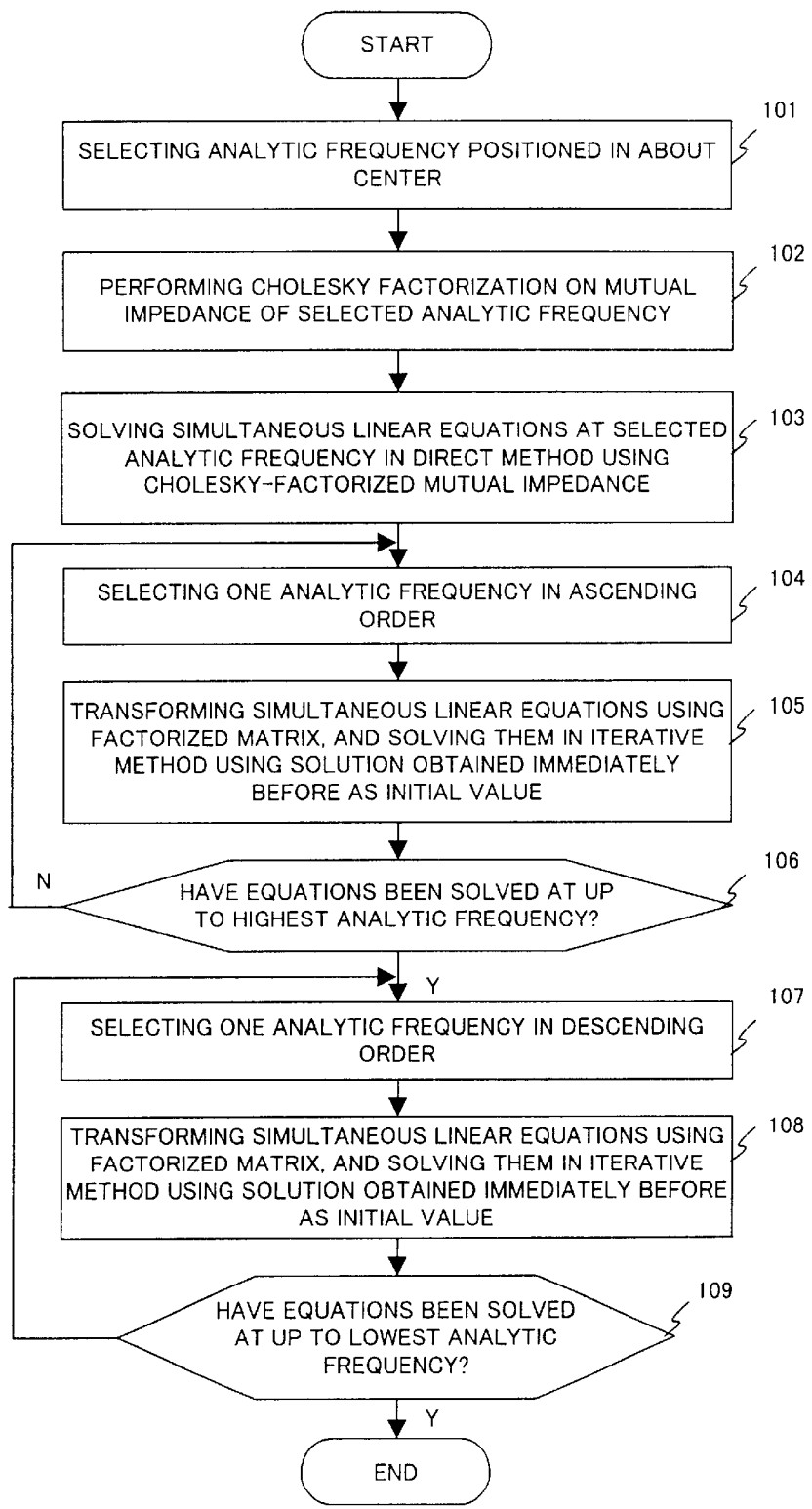
F I G. 14

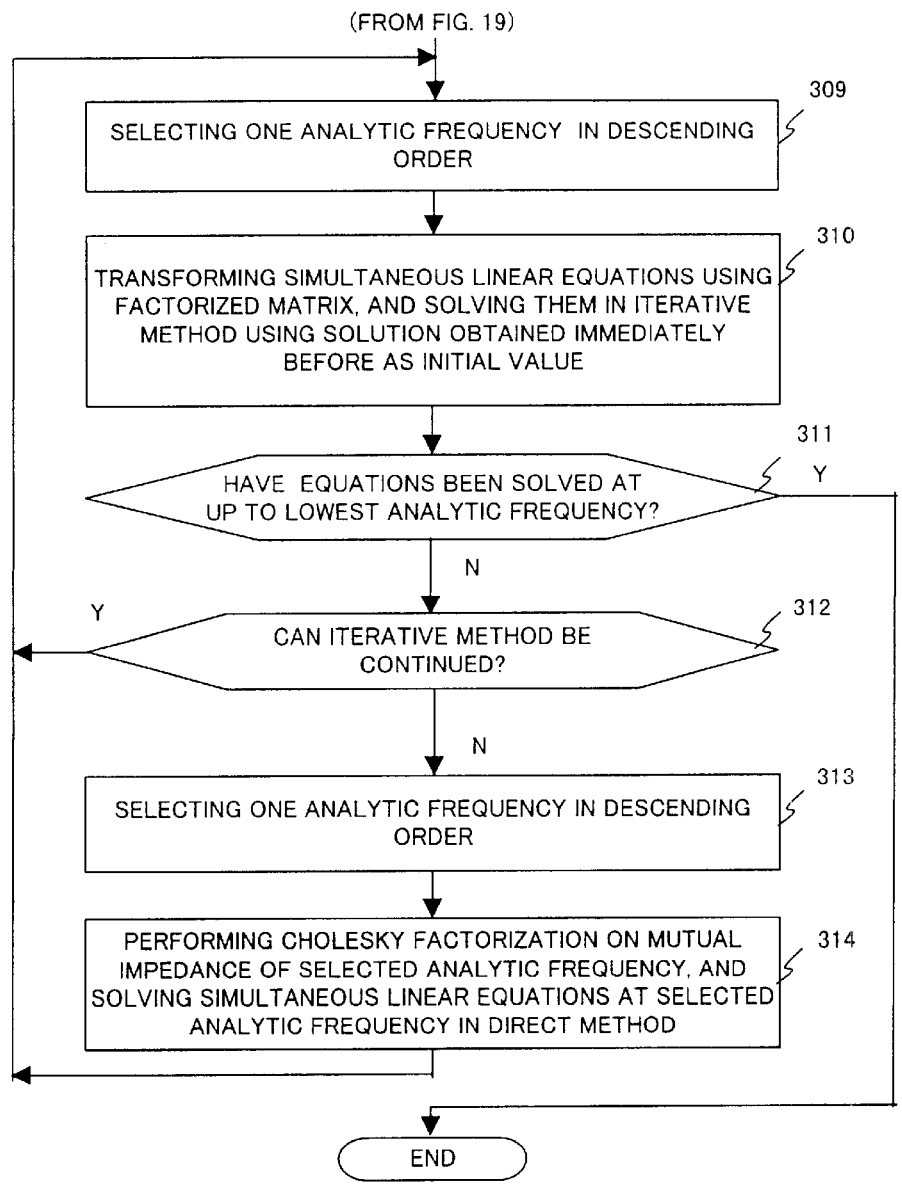
F I G. 20

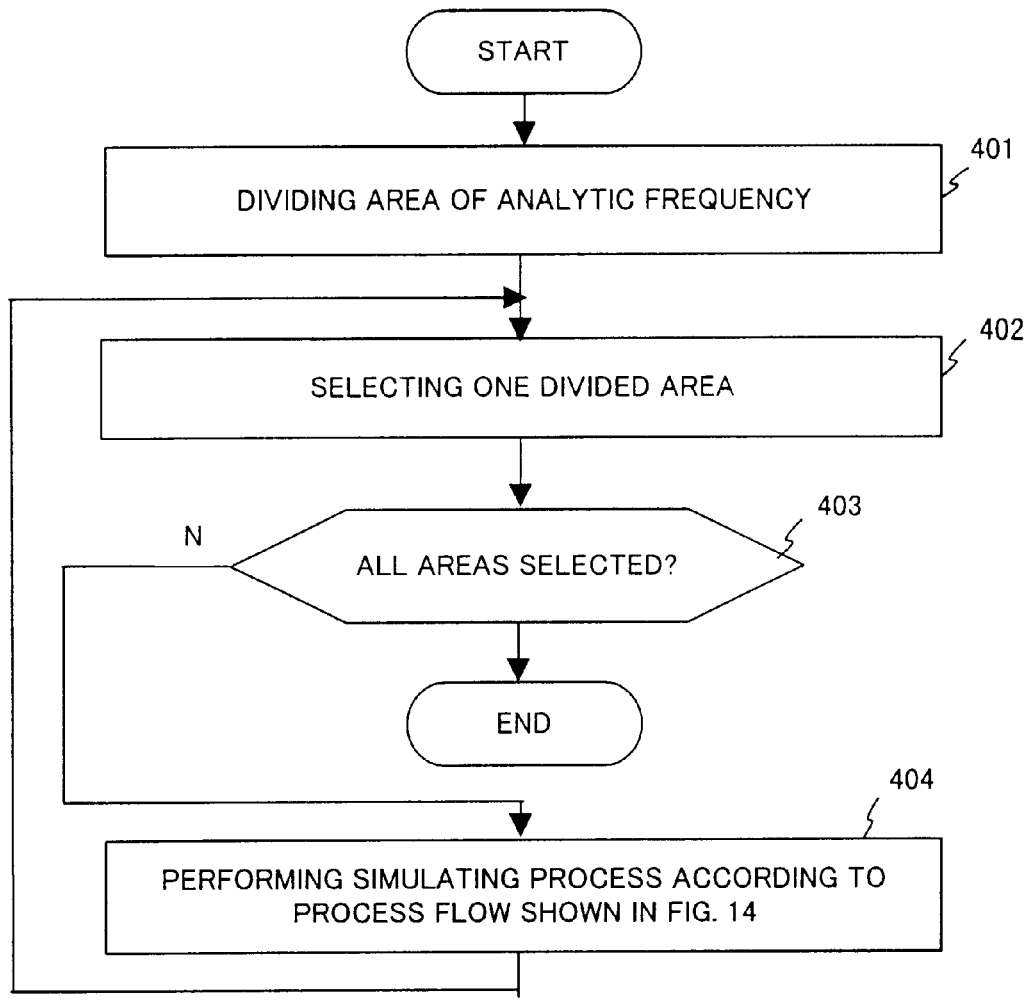
F I G. 22

FIG. 25

$A = LDL^T$ $$L = \begin{pmatrix} \ell_{11} & 0 & 0 & \cdots & & 0 \\ \ell_{21} & \ell_{22} & 0 & & & \\ \vdots & & \ddots & & & \vdots \\ & & & & & 0 \\ \ell_{n1} & \ell_{n2} & \ell_{n3} & \cdots & \ell_{nn} \end{pmatrix}$$

$$D = \begin{pmatrix} d_{11} & 0 & \cdots & & & 0 \\ 0 & d_{22} & & & & \\ \vdots & & \ddots & & & \vdots \\ & & & & & 0 \\ 0 & & \cdots & 0 & \cdots & d_{nn} \end{pmatrix}$$

$d_{ii} = a_{ii} - \sum_{k=1}^{i-1} \ell_{ik}^2 d \quad (i>1), \quad d_{11} = a_{11}$ $\ell_{ij} = (a_{ij} - \sum_{k=1}^{j-1} \ell_{ik}\ell_{jk}d_{kk})/d_{jj} \quad (i>j) \quad \ell_{11} = a_{11}/a_{11}$ $\ell_{ii} = 1$

APPARATUS AND METHOD FOR SIMULATING ELECTRIC CURRENT IN ELECTRONIC APPLIANCES

BACKGROUND OF THE INVENTION

1. Field of the Invention

The present invention relates to an apparatus and a method for simulating an electric current flowing through an electronic appliances by solving simultaneous linear equations defined depending on an analytic frequency, and to a program storage medium storing a program for realizing the simulation apparatus, and more specifically to a simulation apparatus and method for quickly realizing the simulating process, and a program storage medium storing a program used to realizing the simulation apparatus.

There is a social rule that excess electric waves or noise higher than a predetermined level should not be discharged. Actually, they have been strictly regulated according to individual rules in each country in the world.

To satisfy such regulations on electric waves, various countermeasures such as shielding technology, filtering technology, etc. are used. However, it is necessary to develop an appropriate simulating technology to quantitatively figure out to what extent electric waves can be attenuated by each of the technologies.

With the above described background, the Applicant of the present invention has disclosed the invention of a simulating technology to compute the intensity of an electromagnetic field discharged from an electronic appliances in the moment method. To put the simulating technology for practical use, a technology of performing a high-speed simulating process should be established.

2. Description of the Related Art

A method of simulating electromagnetic field analysis can be the difference method, the finite element method, the moment method, etc.

Among them, the moment method only has to set the boundary plane of an analysis target discrete in a 2-dimensional array, and is expected as a method more practical than the difference method and the finite element method which require setting at maximum 4-dimensional time space discrete. A reference document is 'H. N. Wang, J. H. Richmond and M. C. Gilreath: Sinusoidal reaction formulation for radiation and scattering from conducting surface IEEE TRANSACTIONS ANTENNAS PROPAGATION vol. AP-23 1975'.

In these simulating methods, electric currents flowing through each element of an electronic appliance can be simulated by solving simultaneous linear equations defined in a frequency domain. Thus, when the simulation is performed in a time domain in the simulation method, it is necessary to solve simultaneous linear equations on a number of frequencies for the same target as analysis targets. In addition, when there is a wave source having a number of frequencies, it is also necessary to solve simultaneous linear equations on a number of frequencies for the same target as analysis targets.

To solve the simultaneous linear equations at a high speed, the FFS method (Fast Frequency Stepping method) has been used in some cases as described by 'G. Hoyler, R. Unbehauen, An Efficient Algorithm for The Treatment of Multiple Frequencies with The Method of Moments, Proceedings of EMC' 96 ROMA pp. 368–371 (1996). In the FFS method, simultaneous linear equations are first derived using the lowest frequency as an analysis target. Then, the Cholesky factorization ($A=CC^t$) is performed on the coefficient matrix of the simultaneous linear equations, and the simultaneous linear equations are solved in the direct method. Then, an analytic frequency is selected in the ascending order of frequencies, and simultaneous linear equations are derived using the analytic frequency as an analysis target. Then, the simultaneous linear equations are solved in the iterative method using a preconditioned matrix (C) obtained in the first direct method. This is the FFS method.

Described below is a numeric solution of simultaneous linear equations. A method of solving the simultaneous linear equations 'Ax=b' (coefficient matrix $A=(a_{ij})$ is a complex symmetric matrix) as shown in FIG. 1 can be the direct method or the iterative method.

The direct method can be followed by performing the Cholesky factorization on the coefficient matrix A (LU factorization on a symmetric matrix) as shown in FIG. 2, and a solution ($x_i$) is obtained by the equation shown in FIG. 3. The number of required computations is the order of $O(n^3)$ (n is the degree of the coefficient matrix A).

On the other hand, the iterative method referred to as a conjugate gradient method is described below. In the iterative method, a solution ($x_i$) is obtained by obtaining the value 'x(k+1)' at the (k+1)th stage using the values 'x(k), α(k), p(k)' at the k-th stage according to the algorithm shown in FIG. 4. The number of required computations is the order of $O(Kn^2)$ (n is the degree of the coefficient matrix A, and K is the number occurrences having the maximum value of n). Therefore, it has the advantage over the direct method in quantity of computations.

In the iterative method, when the coefficient matrix A is A≈CCτ, which is close to the Cholesky factorization, the original simultaneous linear equations 'Ax=b' are transformed as follows.

$$C^{-1}AC^{t^*-1}C^tx=C^{-1}b$$

where $C^{-1}$ is an inverse matrix of the matrix C, $C^t$ is a transposed matrix of the matrix C, and $C^{t^*-1}$ is an inverse matrix of the transposed matrix of the matrix C.

At this time, the matrix $C^{-1}AC^{t^*-1}$ is very close to a unit matrix, and is expected to quickly converge. This is referred to as a preconditioned conjugate gradient method, and is performed by the algorithm shown in FIG. 5.

When simultaneous linear equations are solved on a number of frequencies for the same target as analysis targets using the above described algorithms in the conventional methods, an FFS method has been used in which simultaneous linear equations are first derived using the lowest frequency as an analysis target, and the coefficient matrix of the simultaneous linear equations is processed in the Cholesky factorization ($A=CC^t$), the simultaneous linear equations are solved in the direct method, then the analytic frequency is selected in the ascending order of frequencies, simultaneous linear equations are derived using the analytic frequency as an analysis target, and the simultaneous linear equations are solved in the iterative method using the preconditioned matrix (C).

However, according to the above described conventional technology, as the analytic frequency selected in the ascending order becomes farther from the lowest frequency, the preconditioned matrix deviates from a desired mode. As a result, the analysis time in the iterative method is prolonged, thereby arising the problem that a high-speed simulating process cannot be performed.

That is, as the analytic frequency selected in the ascending order becomes farther from the lowest frequency, the matrix $C^{-1}AC^{*-1}$ deviates from a unit matrix. As a result, the analysis time in the iterative method is prolonged, thereby arising the problem that a high-speed simulating process cannot be performed.

SUMMARY OF THE INVENTION

The present invention has been developed based on the above described background, and aims at providing a new simulating apparatus and method for quickly realizing a simulating process when an electric current flowing through electronic appliances is simulated by solving simultaneous linear equations defined depending on an analytic frequency in the moment method, etc., and at providing a new program storage medium storing a program for realizing the simulation apparatus.

The present invention is based on an apparatus and a method for simulating an electric current flowing through electronic appliances by solving simultaneous linear equations defined depending on an analytic frequency, or a computer-readable storage medium storing a program for directing a computer to perform the simulation.

According to the first embodiment of the present invention, the following configuration is designed.

First, an analytic frequency is selected from the frequency area to which the analytic frequency belongs excluding the frequencies at both ends of the analytic frequency area.

Then, the simultaneous linear equations defined depending on the selected analytic frequency are solved in the direct method.

Then, the analytic frequencies after the selected analytic frequency are sequentially selected, and the simultaneous linear equations defined by the selected analytic frequency are solved in the iterative method.

With the above described configuration, the frequency distance (frequency difference) between the analytic frequency in which simultaneous linear equations are solved in the iterative method and the frequency in which they are solved in the direct method can be shorter than in the conventional technology. That is, the simultaneous linear equations solved in the iterative method can be transformed into a form in which they can be converged into a solution.

According to the second embodiment of the present invention, the following configuration can be designed.

First, an area to which an analytic frequency belongs is divided into a plurality of areas.

Then, one analytic frequency is selected from each of the divided analytic frequency areas.

Next, the simultaneous linear equations defined depending on the selected analytic frequency are solved in the direct method.

Then, the subsequent analytic frequencies are selected from each of the divided analytic frequency areas, and the simultaneous linear equations defined by the selected analytic frequency are solved in the iterative method.

With the above described configuration, the frequency distance between the analytic frequency in which simultaneous linear equations are solved in the iterative method and the frequency in which they are solved in the direct method can be shorter than in the conventional technology. That is, the simultaneous linear equations solved in the iterative method can be transformed into a form in which they can be converged into a solution.

According to the third embodiment of the present invention, the following configuration can be designed.

First, the first analysis is performed by solving the simultaneous linear equations defined depending on the specified analytic frequency in the direct method.

Then, the second analysis is performed by sequentially selecting the analytic frequencies after the selected analytic frequency, and solving the simultaneous linear equations defined by the selected analytic frequency in the iterative method.

Then, it is determined which is an advantageous method for solving simultaneous linear equations by the second analysis, in the direct method or in the iterative method. If it is determined that the direct method is advantageous, then the first analysis is performed on the simultaneous linear equations.

With the above described configuration, if the analysis time is prolonged by solving the simultaneous linear equations in the iterative method, then the direct method is performed, and the subsequent analysis is performed such that the simultaneous linear equations can be solved in the iterative method using the analysis result. Thus, the simultaneous linear equations solved in the iterative method can be transformed into a form in which they can be converged into a solution at a higher speed.

As described above, a simulating process can be realized at a high speed when a configuration for simulating an electric current flowing through electronic appliances is designed by solving the simultaneous linear equations defined depending on the analytic frequency in the moment method, etc. according to any embodiment of the present invention.

BRIEF DESCRIPTION OF THE DRAWINGS

The present invention will be more apparent from the following detailed description, when taken in conjunction with the accompanying drawings, in which:

FIG. 1 shows an example of simultaneous linear equations;

FIG. 2 shows an equation for obtaining the Cholesky factorization of the coefficient matrix of the left side of the simultaneous linear equations shown in FIG. 1;

FIG. 3 shows the equation of the solution of the simultaneous linear equations shown in FIG. 1 using the Cholesky factorization shown in FIG. 2;

FIG. 4 shows the algorithm for obtaining the solution of the simultaneous linear equations shown in FIG. 1 in the conjugate gradient method.

FIG. 5 shows the algorithm for obtaining the solution of the simultaneous linear equations shown in FIG. 1 in the preconditioned conjugate gradient method;

FIG. 7 shows the flow of the processes performed by the electromagnetic field intensity computation device according to an embodiment of the present invention;

FIG. 9 shows the simultaneous linear equations prepared by executing the moment method;

FIG. 11A shows a common equation for computing the mutual impedance $Z_{ij}$ between the elements i and j in the simultaneous linear equations shown in FIG. 9;

FIG. 11B shows the equation for computing $Z_{13}$ and $Z_{14}$ in the mutual impedance between the mono-poles shown in FIG. 10;

FIG. 13 shows the equation for computing the z direction element and the $\eta$ direction element of an electric field at the observation point P shown in FIG. 12;

FIG. 14 is a flowchart of the contents of the process performed by executing the program for solving simultaneous linear equations according to the first embodiment of the present invention;

FIG. 20 is a flowchart (2) of the contents of the processes performed by the program for solving the simultaneous linear equations according to the third embodiment of the present invention;

FIG. 22 is a flowchart of the contents of the processes performed by the program for solving the simultaneous linear equations according to the fourth embodiment of the present invention;

FIG. 25 shows the equation for performing the Cholesky factorization for correcting the left side of the coefficient matrix of the simultaneous linear equations shown in FIG. 1.

DESCRIPTION OF THE PREFERRED EMBODIMENTS

The present invention is described below in detail according to the embodiments.

Figure 6:
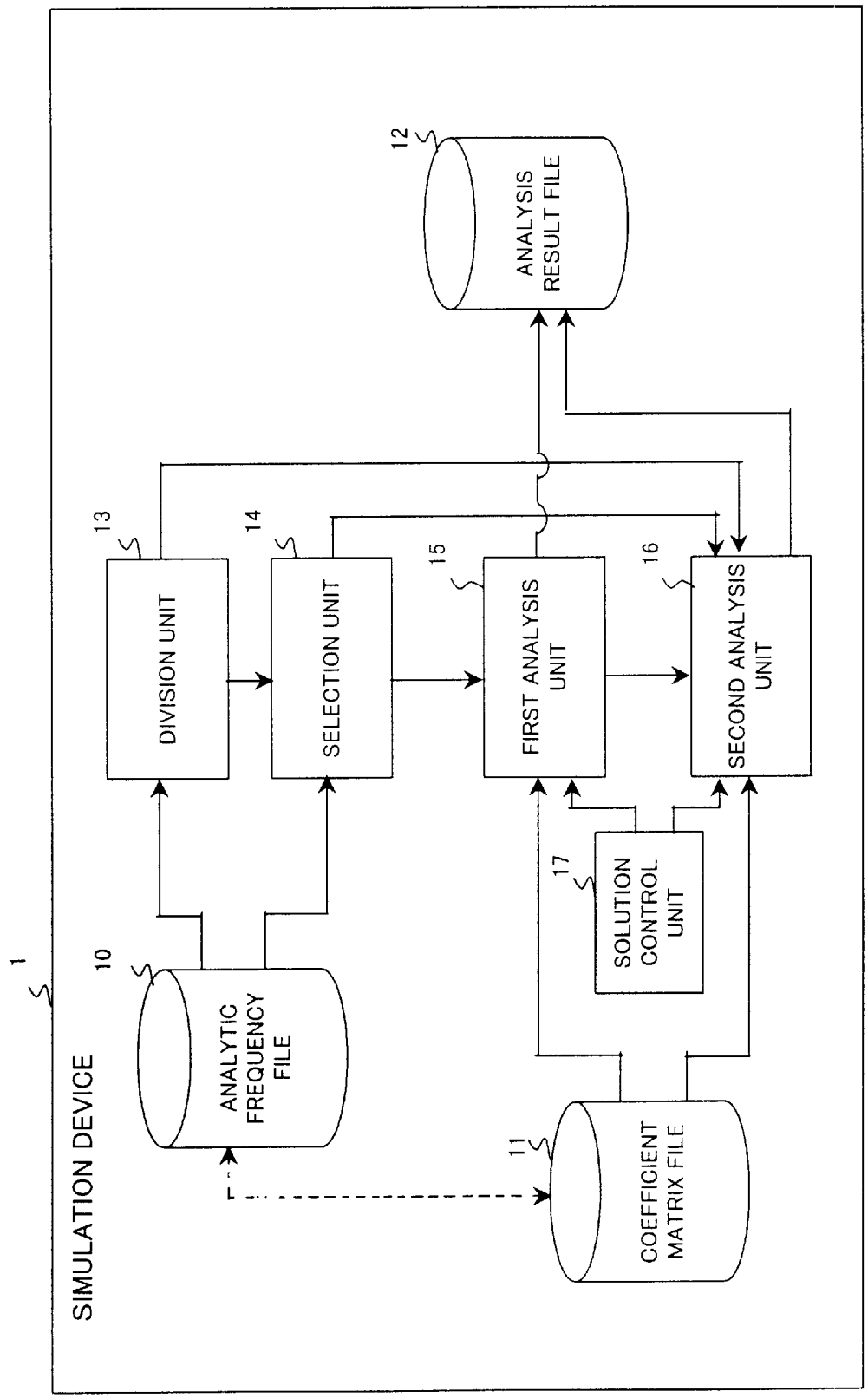
FIG. 6 shows the principle configuration according to the present invention.

FIG. 6 shows the principle configuration of according to the present invention;

In FIG. 6, a simulation device 1 for realizing the present invention simulates an electric current flowing through each element of the electronic appliances by solving the simultaneous linear equations defined based on the analytic frequency.

The simulation device 1 comprises an analytic frequency file 10, a coefficient matrix file 11, an analysis result file 12, a division unit 13, a selection unit 14, a first analysis unit 15, a second analysis unit 16, and a solution control unit 17.

The analytic frequency file 10 stores the information about a frequency to be analyzed. The coefficient matrix file 11 stores the coefficient matrix of the simultaneous linear equations defined depending on the analytic frequency. The analysis result file 12 stores the information about an electric current flowing through each element of an electronic appliance to be analyzed.

The division unit 13 divides an analytic frequency area into a plurality of areas. The selection unit 14 selects an analytic frequency.

The first analysis unit 15 sets the analytic frequency selected by the selection unit 14 as an analysis target, analyzes the coefficient matrix of the simultaneous linear equations into a prescribed format, and solves the simultaneous linear equations in the direct method.

The second analysis unit 16 selects the analytic frequency in the ascending or descending order from the analytic frequency analyzed by the first analysis unit 15, transforms the simultaneous linear equations using the coefficient matrix analyzed by the first analysis unit 15 based on the selected analytic frequency as an analysis target, and solves the transformed simultaneous linear equations in the iterative method.

The solution control unit 17 determines which is an advantageous method, the direct method or the iterative method, to solve the simultaneous linear equations when the second analysis unit 16 is operating. If it determines that the direct method is advantageous, then it stops the analyzing process being performed by the second analysis unit 16 (stopping during the process or when the analyzing process terminates), thereby activating the first analysis unit 15.

The function of the simulation device 1 according to the present invention is practically realized using a program. The program is stored in a floppy disk, a disk at a server, etc., installed on the simulation device 1, and operated in the memory, thereby realizing the present invention.

With the above described configuration, the selection unit 14 selects an analytic frequency preferably positioned in about the center excluding the frequencies at both ends of the area in the simulation device 1 according to the present invention. Then, the first analysis unit 15 defines the analytic frequency selected by the selection unit 14 as an analysis target, analyzes the coefficient matrix of the simultaneous linear equations into the prescribed format, and solves the simultaneous linear equations in the direct method.

Then, the second analysis unit 16 selects the analytic frequency in the ascending or descending order based on the analytic frequency selected by the selection unit 14, defines the selected analytic frequency as an analysis target, transforms the simultaneous linear equations using the coefficient matrix analyzed by the first analysis unit 15, and solves the transformed simultaneous linear equations in the iterative method. At this time, the second analysis unit 16 solves the simultaneous linear equations preferably using the solution obtained in the immediately previous analyzing process as an initial value.

Thus, the simulation device 1 according to the present invention solves the simultaneous linear equations in the direct method using a frequency other than the frequencies at both ends of the analytic frequency area as an analysis target, and solves the simultaneous linear equations in the iterative method while transforming the simultaneous linear equations using the coefficient matrix analyzed in the direct method on the frequencies other than the above described frequency defined as the analysis target. Thus, the frequency distance between the frequency in the iterative method and the frequency in the direct method becomes shorter than in the conventional technology. Therefore, the simultaneous linear equations in the iterative method can be transformed into a form close to a desired form, thereby performing a high-speed analyzing process.

In addition, in the simulation device 1 having the above described configuration according to the present invention, the division unit 13 obtains the division mode in which the total computation time can be minimized according to a prescribed algorithm, and divides an analytic frequency area into a plurality of areas. Then, the selection unit 14 selects an analytic frequency at a position in preferably about the center of each analytic frequency area divided by the division unit 13.

Then, the first analysis unit 15 defines the analytic frequency selected by the selection unit 14 as an analysis target, analyzes the coefficient matrix of the simultaneous linear equations into a prescribed format, and solves the simultaneous linear equations in the direct method.

Then, the second analysis unit 16 selects from each of the analytic frequency areas divided by the division unit 13 the analytic frequency in the ascending or descending order based on the analytic frequency selected by the selection unit 14, defines the selected analytic frequency as an analysis target, transforms the simultaneous linear equations using the coefficient matrix analyzed by the first analysis unit 15, and solves the transformed simultaneous linear equations in the iterative method. At this time, the second analysis unit 16 solves the simultaneous linear equations preferably using the solution obtained in the immediately previous analyzing process as an initial value.

Thus, the simulation device 1 according to the present invention solves the simultaneous linear equations in the direct method using each division of a divided analytic frequency area as an analysis target, and solves the simultaneous linear equations in the iterative method while transforming the simultaneous linear equations using the coefficient matrix analyzed in the direct method on the frequencies other than the above described frequency defined as the analysis target. Thus, the frequency distance between the frequency in the iterative method and the frequency in the direct method becomes shorter than in the conventional technology. Therefore, the simultaneous linear equations in the iterative method can be transformed into a form close to a desired form, thereby performing a high-speed analyzing process.

In the simulation device 1 with the above described configuration, the first analysis unit 15 analyzes the coefficient matrix of the simultaneous linear equations with a specified analytic frequency defined as an analysis target, and solves the simultaneous linear equations in the direct method.

Then, the second analysis unit 16 selects the analytic frequency in the ascending or descending order from the analytic frequency analyzed by the first analysis unit 15, defines the selected analytic frequency as an analysis target, transforms the simultaneous linear equations using the coefficient matrix analyzed by the first analysis unit 15, and solves the transformed simultaneous linear equations in the iterative method. At this time, the second analysis unit 16 solves the simultaneous linear equations preferably using the solution obtained in the immediately previous analyzing process as an initial value.

The solution control unit 17 determines which is an advantageous method, the direct method or the iterative method, to solve the simultaneous linear equations when the second analysis unit 16 is operating. If it determines that the direct method is advantageous, then it stops the analyzing process being performed by the second analysis unit 16 (stopping during the process or when the analyzing process terminates), thereby activating the first analysis unit 15.

For example, when the frequency distance from the analytic frequency latest analyzed by the first analysis unit 15 is long, the solution control unit 17 determines that the direct method is advantageous. When the determination time set from the analysis time obtained from the first analysis unit 15 is compared with the analysis time from the second analysis unit 16, and if the analysis time is longer than the determination time, it is determined that the direct method is advantageous. When the allowable number of iterative processes is set from the determination time set based on the analysis from the first analysis unit 15 and the analysis time per analyzing process performed by the second analysis unit 16, and if the number of iterative processes excels the allowable number of iterative processes, then it is determined that the direct method is advantageous.

Thus, when simultaneous linear equations are solved in the iterative method while being transformed using a coefficient matrix analyzed in the direct method, the simulation device 1 according to the present invention performs the direct method if the frequency distance between the frequency analyzed in the iterative method and the frequency analyzed in the direct method becomes longer and, as a result, if the analysis time in the iterative method using the coefficient matrix is long. Accordingly, a coefficient matrix analyzed in the format applicable to the analytic frequency is obtained. Using the coefficient matrix, simultaneous linear equations are solved in the iterative method. Therefore, since the simultaneous linear equations solved in the iterative method can be transformed in a desired form, thereby performing a high-speed analyzing process.

Thus, in the simulation device 1 according to the present invention, a method of simulating an electric current can be performed at a high speed with the configuration in which an electric current flowing through electronic appliances is simulated by solving the simultaneous linear equations defined depending on the analytic frequency in the moment method, etc.

FIG. 7 shows the flow of the processes performed by an electromagnetic field intensity computation device 20 for realizing the present invention.

The electromagnetic field intensity computation device 20 simulates the intensity of an electromagnetic field discharged from an electronic appliance, and comprises an electronic appliance data file 21 storing the structure information about an electronic appliance to be simulated; a simultaneous linear equations generation program 22, installed through a floppy disk, a line, etc., for generating simultaneous linear equations in the moment method; a simultaneous linear equations storage file 23 storing simultaneous linear equations generated by the simultaneous linear equations generation program 22 and solved in the moment method; a simultaneous linear equations solution program 24, installed through a floppy disk, a line, etc., for computing the electric current flowing through an electronic appliance by solving the simultaneous linear equations in the moment method; an electromagnetic field intensity computation program 25, installed through a floppy disk, a line, etc., for computing the intensity of an electromagnetic field discharged from an electronic appliance from the computation result of the simultaneous linear equations solution program 24; and an output device 26 for displaying the computation result of the electromagnetic field intensity computation program 25.

Figure 8:
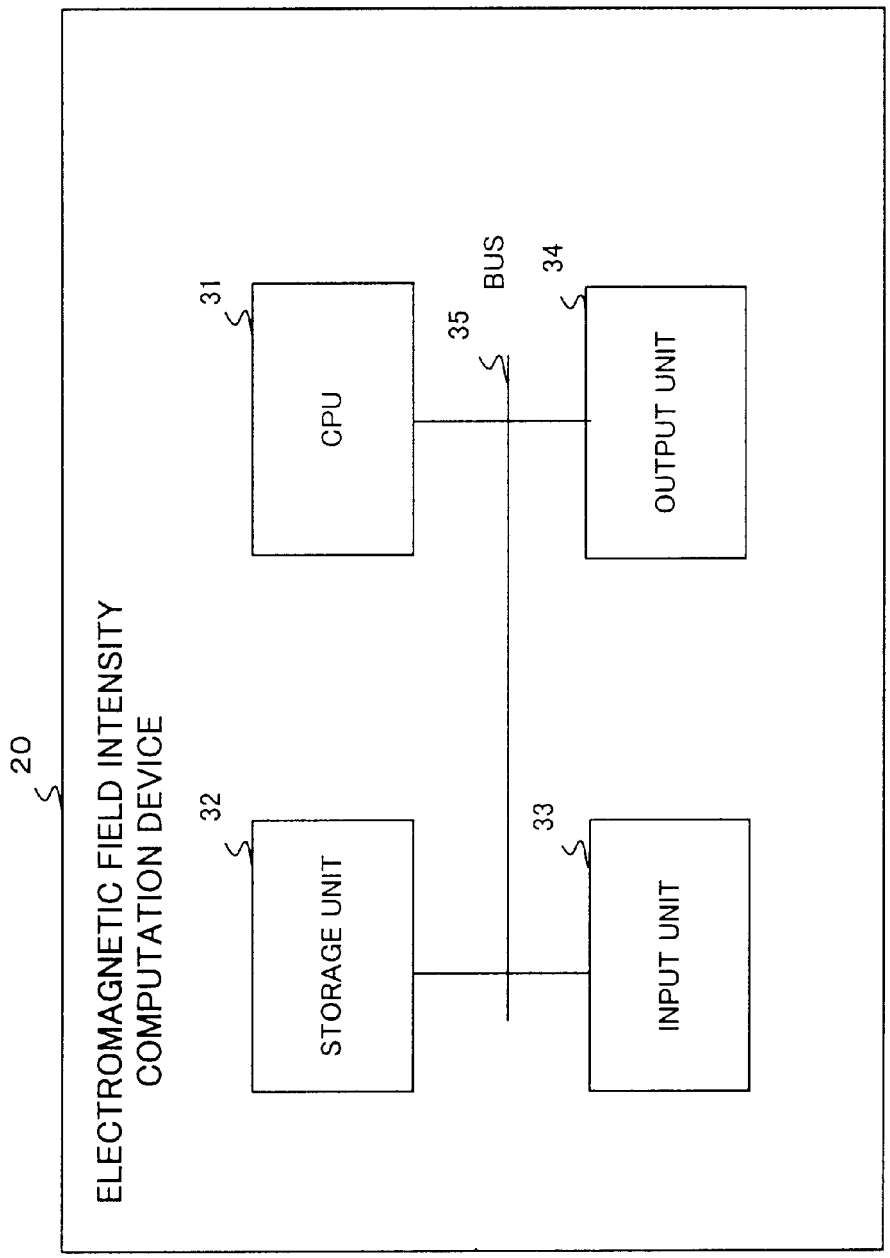
FIG. 8 shows the internal configuration of the electromagnetic field intensity computation device according to an embodiment of the present invention.

FIG. 8 shows the internal configuration of the electromagnetic field intensity computation device 20 according to an embodiment of the present invention.

In FIG. 8, a CPU 31, a storage unit 32, an input unit 33, and an output unit 34 are connected to a bus 35 so that they can transmit and receive data to and from each other.

The CPU 31 controls the entire electromagnetic field intensity computation device 20. A desired process can be realized by the CPU 31 executing each program shown in FIG. 7.

The storage unit 32 includes ROM storing a program for controlling the entire electromagnetic field intensity computation device 20, RAM used as a work area when the CPU 31 executes various programs, a hard disk storing programs and data files shown in FIG. 7, etc.

The input unit 33 accepts the input of various data from external units, and is used when, for example, the electronic appliance data file 21 shown in FIG. 7 is input.

The output unit 34 outputs various data to external units, and comprises the output device 26, etc. shown in FIG. 7.

Described below is each program shown in FIG. 7.

The simultaneous linear equations generation program 22 approximates an electronic appliance to be simulated in a meshed model according to the structure information about the electronic appliance stored in the electronic appliance data file 21, and sets an analytic frequency from the wave source of the electronic appliance. Then, it obtains about the analytic frequency the mutual impedance, the mutual admittance, and the mutual reactance among meshed elements by performing predetermined computing processes, and performs a process of generating simultaneous linear equations in the moment method for deriving an electric current and a magnetic current flowing through each element of the electronic appliance based on the resultant mutual impedance, etc. and a wave source.

Figure 9:
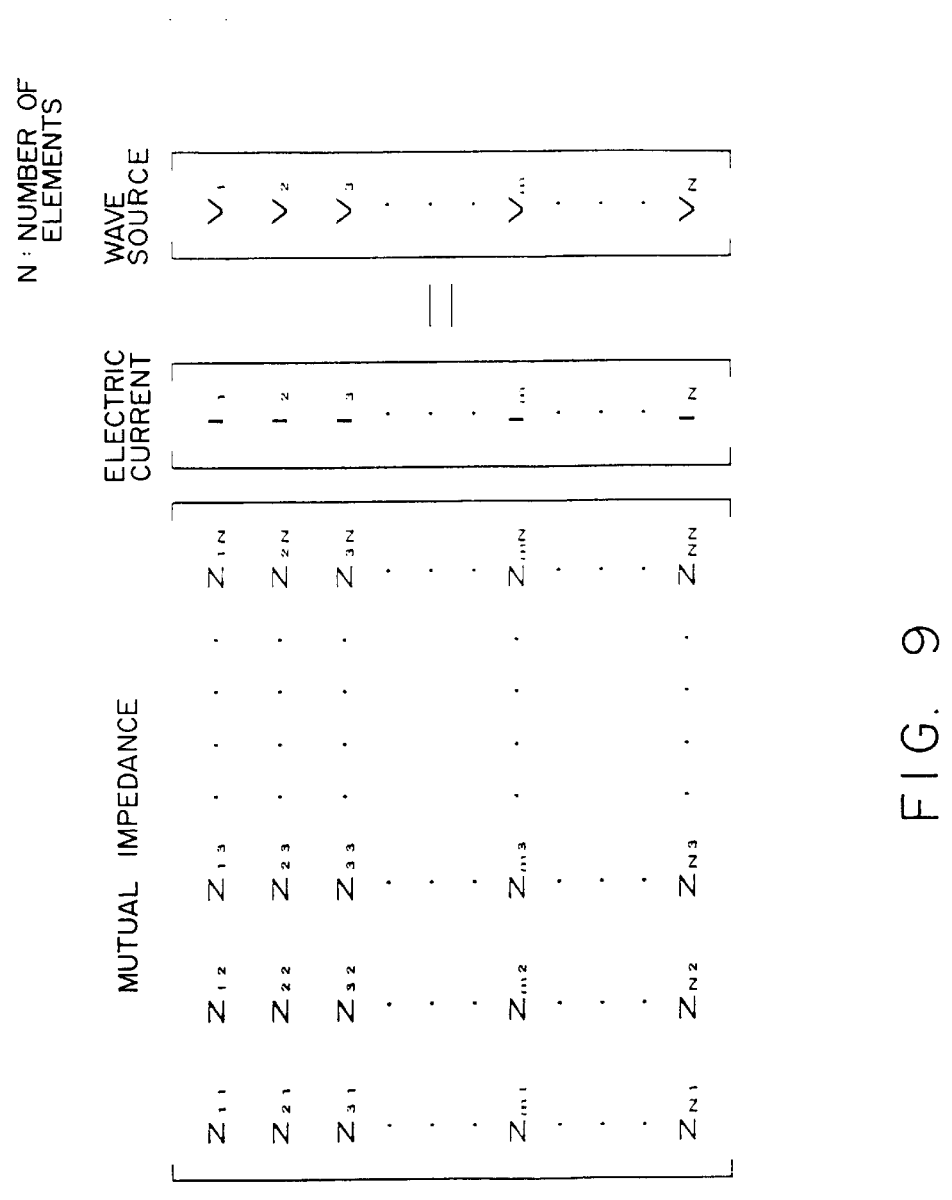

It is assumed in the following descriptions that the electronic appliance is formed only by a metal object. In this case, the mutual impedance $Z_{ij}$ among the elements of the electronic appliance at the analytic frequency is obtained. Simultaneous linear equations in the moment method shown in FIG. 9 can be generated based on the obtained mutual impedance $Z_{ij}$, the wave source $V_i$ of the analytic frequency element, and the electric current $I_i$ of the analytic frequency element flowing through the electronic appliance.

Figure 10:
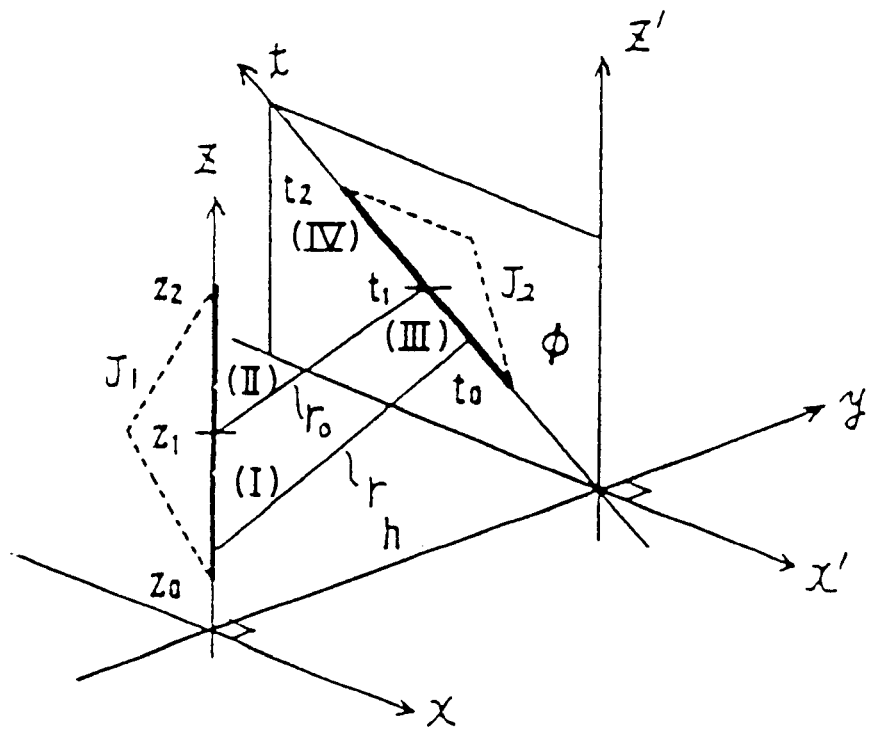
FIG. 10 is used when the method of computing the mutual impedance in the simultaneous linear equations shown in FIG. 9 is explained.

The computed mutual impedance can be obtained by assuming the mono-pole ((I) through (IV) in FIG. 10) as shown in FIG. 10.

That is, a common equation of the mutual impedance $Z_{ij}$ between an element i and an element j is expressed by the equation shown in FIG. 11A. In FIG. 11A, $\omega$ indicates the circular frequency, k indicates the number of waves, r indicates the distance between mono-poles, $J_1$ and $J_2$ indicate the distribution form of the electric current on a mono-pole, $\theta$ indicates the tilt among mono-poles, and the following equation exists.

$\rho_1 = (-1/j\omega) \times [\partial J_1/\partial t]$ $\rho_2 = (-1/j\omega) \times [\partial J_2/\partial t]$ mono-pole (I) $J_1 = \sin k(z-z_0)/\sin kd_1$ mono-pole (II) $J_1 = \sin k(z_2-z)/\sin kd_2$ mono-pole (III) $J_2 = \sin k(t-t_0)/\sin kd_3$ mono-pole (IV) $J_2 = \sin k(t_2-t)/\sin kd_4$ where $J_1$ and $J_2$ indicate the electric current distributions on the mono-pole, d1 indicates the length of the mono-pole (I), d2 indicates the length of the mono-pole (II), d3 indicates the length of the mono-pole (III), and d4 indicates the length of the mono-pole (IV).

On the assumption, the mutual impedance $Z_{13}$ between the mono-poles (I) and (III), and the mutual impedance $Z_{14}$ between the mono-poles (I) and (IV) are represented by the equations shown in FIG. 11B.

The mutual impedance $Z_{23}$ between the mono-poles (II) and (III), and the mutual impedance $Z_{24}$ between the mono-poles (II) and (IV) are represented by the similar equations. Thus, the mutual impedance $Z_{ij}$ ($=Z_{13}+Z_{14}+Z_{23}+Z_{24}$) between the elements i and j can be obtained.

Thus, the computed mutual impedance is a complex symmetric matrix indicating '$Z_{ij}=Z_{ji}$'.

After the process performed by the simultaneous linear equations generation program 22, the simultaneous linear equations storage file 23 stores the simultaneous linear equations in the moment method generated by the simultaneous linear equations generation program 22 by storing the mutual impedance $Z_{ij}$ at the analytic frequency computed by the simultaneous linear equations generation program 22, and the wave source $V_i$ extracted from the simultaneous linear equations generation program 22 for each of the analytic frequencies set by the simultaneous linear equations generation program 22.

The simultaneous linear equations solution program 24 computes the electric current $I_i$ of the analytic frequency element flowing through each element of an electronic appliance by solving the simultaneous linear equations in the moment method stored in the simultaneous linear equations storage file 23. When the number of simultaneous linear equations in the moment method stored in the simultaneous linear equations storage file 23 becomes large, that is, when the number of analytic frequencies is large, a characteristic process according to the present invention described below is performed to finish the computing process at a high speed in consideration that a long time is taken to compute an electric current flowing through an electronic appliance.

Figure 12:
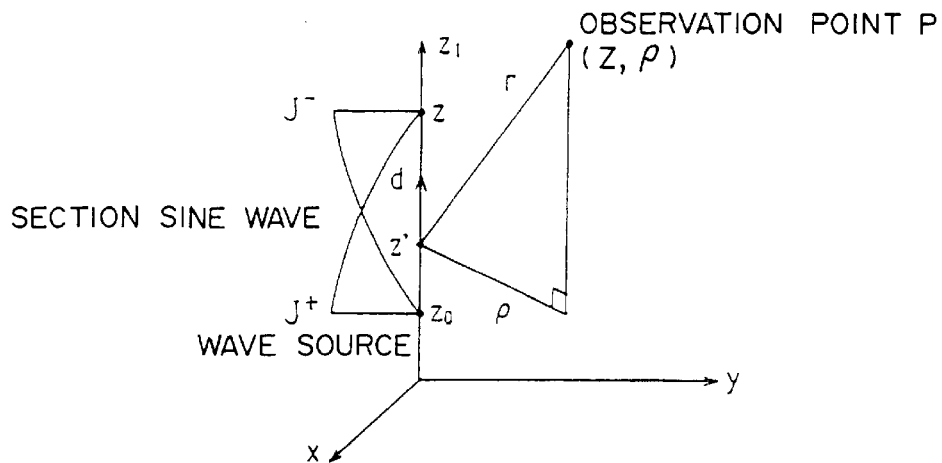
FIG. 12 shows the relationship between an assumed wave source and an observation point referred to for explanation of the process of computing the intensity of an electromagnetic field.

The electromagnetic field intensity computation program 25 computes the intensity of an electromagnetic field discharged by an electronic appliance from an electric current flowing through each element of the electronic appliance computed by the simultaneous linear equations solution program 24. Since the computing process is well-known, the detailed explanation is omitted here. For example, if the relationship between the wave source and the observation point as shown in FIG. 12 is assumed, and if $J^+$ shown in FIG. 12 as the electric current distribution of a wave source is assumed, then the z direction element $Ez^+$ and the $\rho$ direction element $E\rho^+$ of the electric field by the electric current $J^+$ can be computed by the equation shown in FIG. 13.

FIG. 14 shows an embodiment of the flow of the process performed by the simultaneous linear equations solution program 24. The present invention is described below in detail according to the process flow.

When a request to compute an electric current flowing through each element of an electronic appliance to be simulated, the simultaneous linear equations solution program 24 first selects in step 101 an analytic frequency positioned preferably in about the center of the analytic frequencies stored in the simultaneous linear equations storage file 23.

Then, in step 102, the mutual impedance $Z_o$ of the selected analytic frequency is read from the simultaneous linear equations storage file 23, and is analyzed into the format as shown in FIG. 2 in the Cholesky factorization ($Z_o=CC^t$). Then, in step 103, the simultaneous linear equations '$Z_o\,I_o=V_o$' at the selected analytic frequency are solved in the direct method using the mutual impedance $Z_o$ processed in the Cholesky factorization by the equation shown in FIG. 3.

Then, in step 104, an analytic frequency fs (s=1, 2, 3, . . . ) is selected in the ascending order from the analytic frequencies stored in the simultaneous linear equations storage file 23 starting with the analytic frequency selected in step 101. Then, in step 105, the simultaneous linear equations '$Z_s\,I_s=V_s$' at the analytic frequency fs selected in step 104 using the factorized matrix C obtained in step 102 are transformed into '$C^{-1}Z_sC^{t*-1}C^t\,I_s=C^{-1}V_s$', and are then solved in the iterative method with the solution $I_{s-1}$ obtained at the analytic frequency $f_{s-1}$ immediately before the selected analytic frequency used as an initial value of $I_s$.

The solution $I_{s-1}$ obtained at the analytic frequency $f_{s-1}$ immediately before the selected analytic frequency is used as an initial value of $I_s$ because a short distance between the analytic frequencies prevents the solution $I_{s-1}$ obtained at the analytic frequency $f_{s-1}$ immediately before the selected analytic frequency from being outstandingly different from $I_s$, thereby obtaining $I_s$ within the smaller number of iterative processes by initializing therefrom.

Then, in step 106, it is determined whether or not the simultaneous linear equations have been solved at up to the highest analytic frequency in the selecting process in step 104. If it is determined that they have not been solved up to that point, then control is returned to step 104. If it is determined that they have already been solved up to that point, then control is passed to step 107, and one analytic frequency $f_{-s}$ (s=1, 2, 3, . . . ) is selected in the descending order from the analytic frequencies stored in the simultaneous linear equations storage file 23 starting with the analytic frequency selected in step 101.

Then, in step 108, the simultaneous linear equations '$Z_{-s}\,I_{-s}=V_{-s}$' at the analytic frequency $f_{-s}$ selected in step 107 using the factorized matrix C obtained in step 102 are transformed into '$C^{-1}Z_{-s}C^{t*-1}C^tI_{-s=C-1}V_{-s}$', and are then solved, for the above described reason, in the iterative method with the solution $I_{s-1}$ obtained at the analytic frequency $f_{-s+1}$ immediately before the selected analytic frequency used as an initial value of $I_{-s}$.

Then, in step 109, it is determined whether or not the simultaneous linear equations have been solved at up to the lowest analytic frequency in the selecting process in step 107. If it is determined that they have not been solved up to that point, then control is returned to step 107. If it is determined that they have already been solved up to that point, then the entire process terminates.

Figure 15:
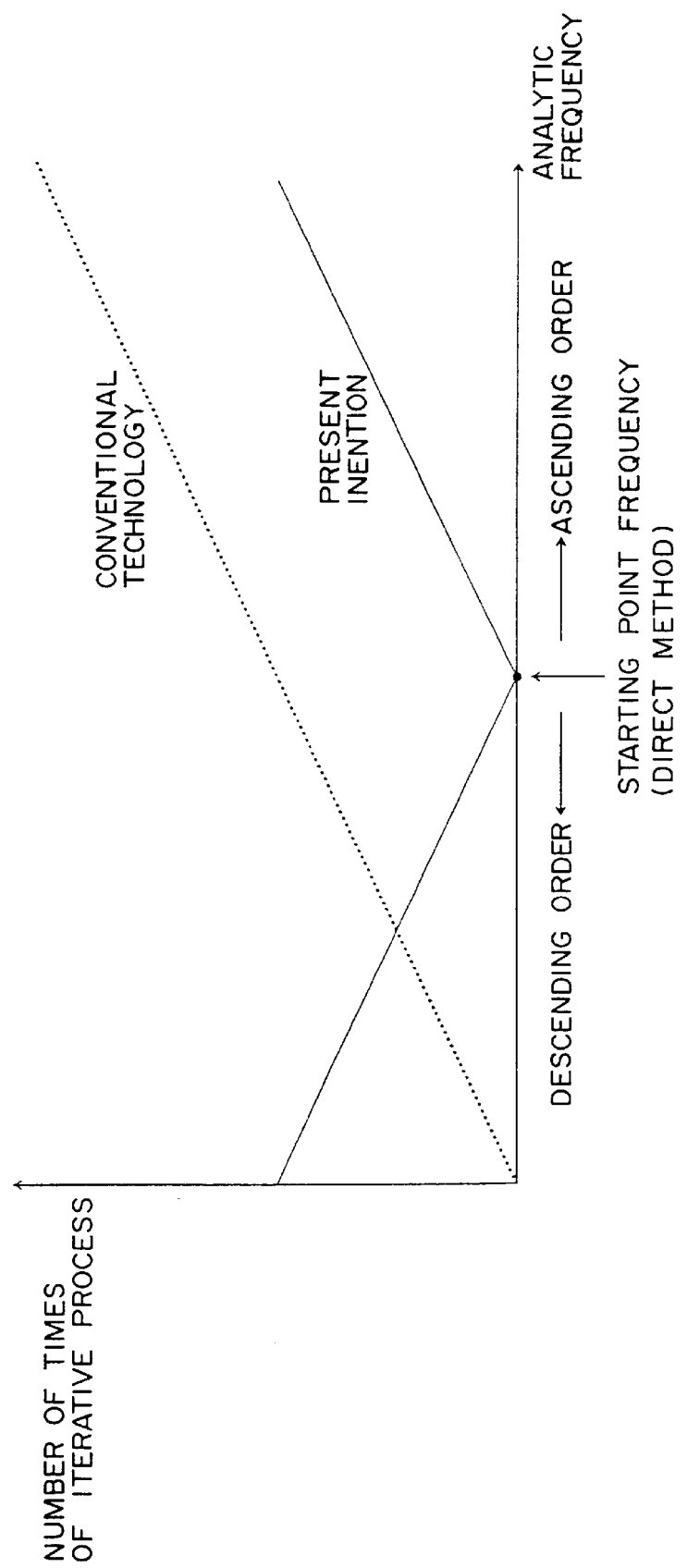
FIG. 15 shows the relationship between the number of occurrences of the iterative method required when a solution is obtained by executing the program for solving the simultaneous linear equations shown in the flowchart shown in FIG. 14 and the analytic frequency.

Thus, the simultaneous linear equations solution program 24 solves simultaneous linear equations in the direct method on the analytic frequency at the starting point with the analytic frequency positioned in about the center preferably defined as the starting point as shown in FIG. 15, transforms the simultaneous linear equations using the factorized matrix obtained in the direct method while selecting other analytic frequencies in the ascending or descending order, and solves them in the iterative method.

On the other hand, in the conventional technology, simultaneous linear equations are solved in the direct method on the analytic frequency at the starting point with the lowest analytic frequency defined as the starting point as shown by the broken lines in FIG. 15, the simultaneous linear equations are transformed using the factorized matrix obtained in the direct method while selecting other analytic frequencies in the ascending order, and solves them in the iterative method.

As shown in FIG. 15, the farther from the frequency at the starting point, the farther from a preferable format of simultaneous linear equations based on the factorized matrix obtained in the direct method. As a result, the number of iterative processes becomes larger in the iterative method. Therefore, the simultaneous linear equations solution program 24 executes the process flow shown in FIG. 14 to solve the simultaneous linear equations at a speed higher than the conventional method in which the lowest analytic frequency is the starting point, thereby quickly computing the electric current flowing through each element of an electronic appliance.

Furthermore, the simultaneous linear equations solution program 24 sets the solution obtained at the immediately previous analytic frequency as the initial value when the iterative method is performed, thereby preforming the high speed process with high precision.

Figure 16:
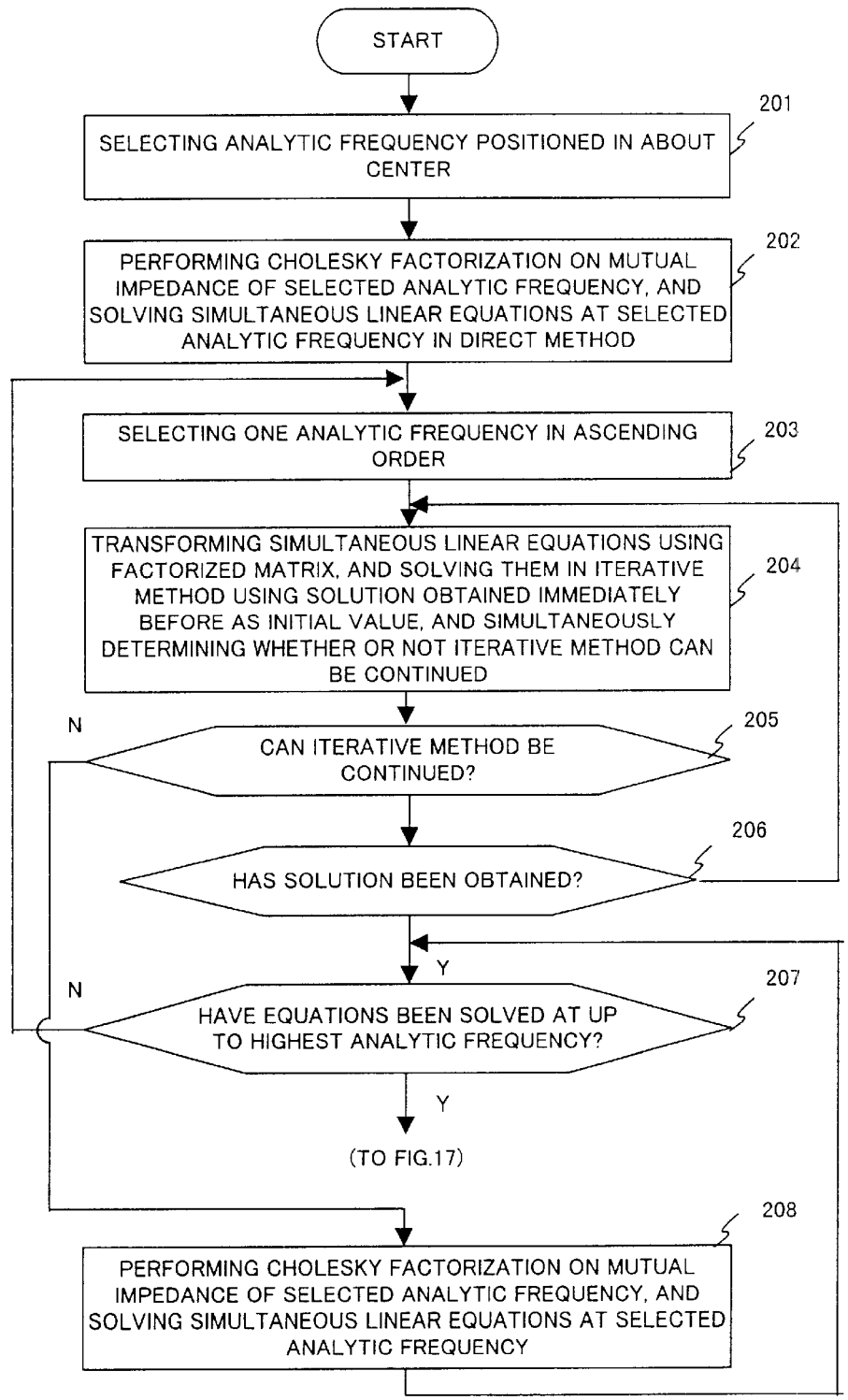
FIG. 16 is a flowchart (1) of the contents of the processes performed by executing the program for solving the simultaneous linear equations according to the second embodiment of the present invention.
Figure 17:
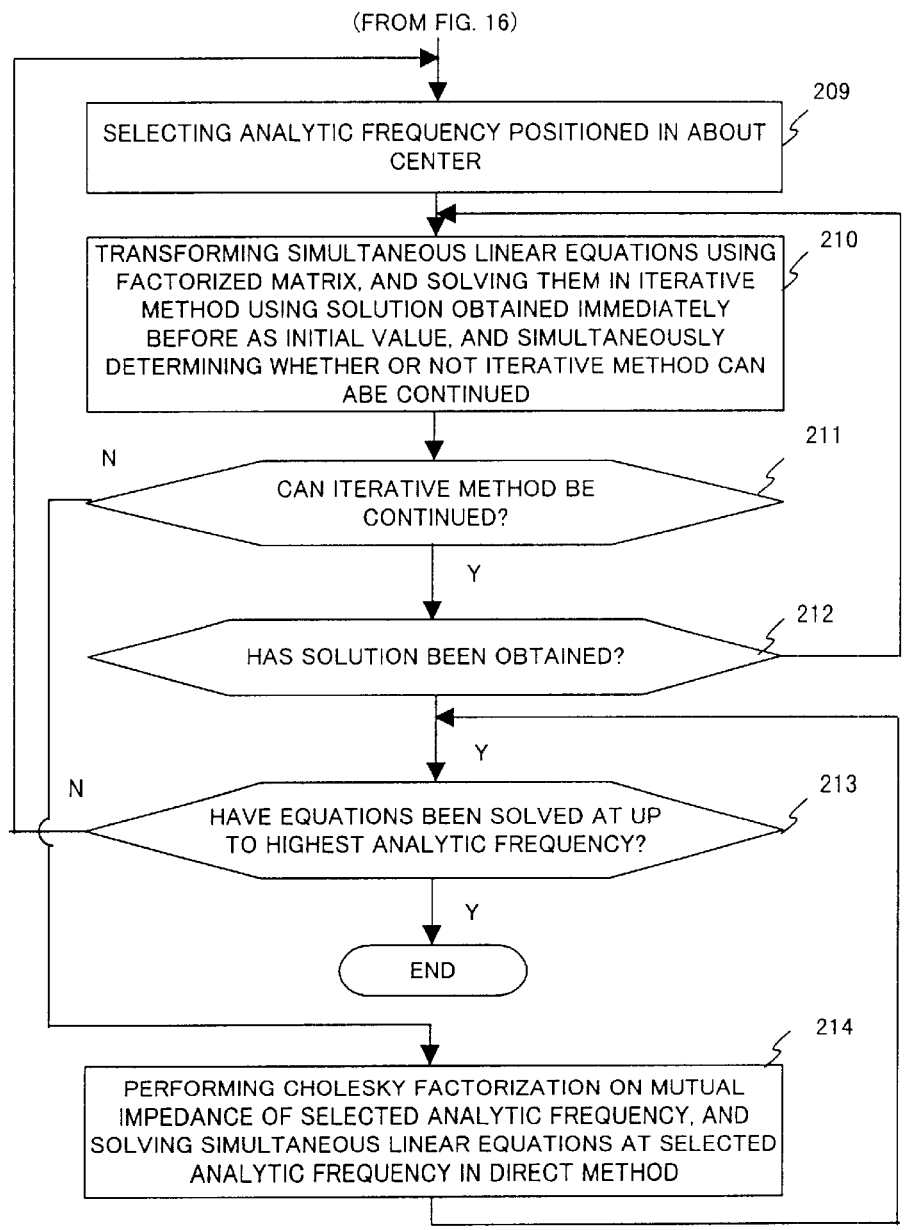
FIG. 17 is a flowchart (2) of the contents of the processes performed by executing the program for solving the simultaneous linear equations according to the second embodiment of the present invention.

FIGS. 16 and 17 show another embodiment of the process flow performed by the simultaneous linear equations solution program 24.

According to the process flow, the simultaneous linear equations solution program 24 selects an analytic frequency preferably positioned in about the center of the analytic frequencies stored in the simultaneous linear equations storage file 23 in step 201 when a request to compute the electric current flowing through each element of an electronic appliance to be simulated is issued.

Then, in step 202, the mutual impedance $Z_o$ of the selected analytic frequency is read from the simultaneous linear equations storage file 23, and is processed by the Cholesky factorization ($Z_o=CC^t$) into the form as shown in FIG. 2. Using the Cholesky-factorized mutual impedance $Z_o$, the simultaneous linear equations '$Z_o\,I_o=V_o$' at the selected analytic frequency are solved in the direct method by the equation shown in FIG. 3.

Then, in step 203, an analytic frequency $f_s$ (s=1, 2, 3, . . . ) is selected in the ascending order from the analytic frequencies stored in the simultaneous linear equations storage file 23 starting with the analytic frequency selected in step 201. Then, in step 204, while it is determined whether or not the iterative method can be continued on a predetermined cycle, the simultaneous linear equations '$Z_s\,I_s=V_s$' at the analytic frequency fs selected in step 203 using the factorized matrix C obtained in step 202 are transformed into '$C^{-1}Z_sC^{t*-1}C^tI_s=C^{-1}$', and are then solved in the iterative method with the solution $I_{s-1}$, obtained at the analytic frequency $f_{s-1}$ immediately before the selected analytic frequency used as an initial value of $I_s$.

The process of determining in step 204 whether or not the iterative method can be continued is performed by, for example, setting as a determination value the frequency distance from the analytic frequency in the direct method in which the factorized matrix C has been obtained, determining that the iterative method can be continued when the analytic frequency in the iterative method does not exceed the determination value, and determining that the iterative method cannot be continued when it exceeds the determination value. Otherwise, the allowable analysis time $T_o$ ($T_o<T$) in the iterative method is set as a product of the analysis time T in the direct method required to obtain the factorized matrix C and a coefficient set between 0 and 1. When the analysis time in the iterative method is smaller than the allowable analysis time $T_o$, it is determined that the iterative method can be continued. When it is equal to or larger than the allowable analysis time, it is determined that the iterative method cannot be continued. Otherwise, the analysis time $t_1$ per iterative process is obtained by counting the analysis time required to perform the iterative process for a predetermined number of times after entering the iterative method, and then the allowable number K of times of the iterative process is set using the equation '$K=T_o/t_1$'. When the number of times of the iterative process in the iterative method is smaller than the allowable number K of times of the iterative process, it is determined that the iterative method can be continued. When it is equal to or larger than the allowable number K of times of the iterative process, it is determined that the iterative method cannot be continued.

Thus, if the simultaneous linear equations transformed into '$C^{-1}Z_sC'^{*-1}C'I_s=C^{-1}V_s$' are solved in the iterative method while it is determined in step 204 whether or not the iterative method can be continued, and it is determined in step 205 that the iterative method can be continued, then control is passed to step 206, and it is determined whether or not a solution has been obtained in the analyzing process in step 204. If it is determined that no solution has been obtained yet, control is returned to step 204, thereby continuing the iterative method performed in step 204.

On the other hand, if it is determined in step 206 that a solution has been obtained in the analyzing process in step 204, then control is passed to step 207, and it is determined whether or not the simultaneous linear equations have been solved at up to the highest analytic frequency in the selecting process in step 203. If it is determined that they have not been solved up to that point, then control is returned to step 203. If it is determined that they have been solved, control is passed to step 209 (process flow shown in FIG. 17) described later.

If it is determined in step 205 that the iterative method cannot be continued, then control is passed to step 208, the iterative method performed in step 204 is suspended, the mutual impedance $Z_s$ is processed in the Cholesky factorization ($Z_s=CC_t$) into the format as shown in FIG. 2 so that the simultaneous linear equations '$Z_z I_s=V_s$' at the analytic frequency $f_s$ selected in step 203 can be solved in the direct method. After solving the simultaneous linear equations '$Z_z I_s=V_s$' in the direct method using the Cholesky-factorized mutual impedance by the equation shown in FIG. 3, control is passed to step 207.

Then, as described above, it is determined in step 207 whether or not the simultaneous linear equations have been solved at up to the highest analytic frequency in the selecting process in step 203. If it is determined that they have not been solved up to that point, then control is returned to step 203. If it is determined that they have been solved up to that point, then control is passed to step 209 described later.

When the process has been performed through step 208 during the analyzing process in the iterative method in step 204, the simultaneous linear equations at the analytic frequency selected in step 203 are transformed using the factorized matrix C obtained in step 208.

When the process of analyzing an analytic frequency on the ascending side from the analytic frequency selected in step 201 terminates in the processes in steps 203 through 208, control is passed to step 209 (process flow shown in FIG. 17), and an analytic frequency $f_{-s}$ (s=1, 2, 3, . . . ) is selected in the descending order from the analytic frequencies stored in the simultaneous linear equations storage file 23 starting with the analytic frequency selected in step 201.

Then, in step 210, while it is determined whether or not the iterative method can be continued on a predetermined cycle using the above described method, the simultaneous linear equations '$Z_{-s} I_{-s}=V_{-s}$' at the analytic frequency $f_{-s}$ selected in step 209 using the factorized matrix C obtained in step 202 are transformed into '$C^{-1}Z_{-s}C'^{*-1}C'I_{-s}=C^{-1}V_{-s}$', and are then solved in the iterative method with the solution $I_{-s+1}$ obtained at the analytic frequency $f_{-s+1}$ immediately before the selected analytic frequency used as an initial value of $I_{-s}$.

Thus, if it is determined in step 211 whether or not the iterative method can be continued, and that it can be continued, then control is passed to step 212, and it is determined whether or not a solution has been obtained in the analyzing process in step 210. If it is determined that no solution has been obtained yet, control is returned to step 210, thereby continuing the iterative method performed in 210.

On the other hand, if it is determined in step 212 that a solution has been obtained in the analyzing process in step 210, then control is passed to step 213, and it is determined whether or not the simultaneous linear equations have been solved at up to the lowest analytic frequency in the selecting process in step 209. If it is determined that they have not been solved up to that point, then control is returned to step 209. If it is determined that they have been solved, the entire process terminates.

If it is determined in step 211 that the iterative method cannot be continued, then control is passed to step 214, the iterative method performed in step 210 is suspended, the mutual impedance $Z_{-s}$ is processed in the Cholesky factorization ($Z_{-s}=CC^t$) into the format as shown in FIG. 2 so that the simultaneous linear equations '$Z_{-z} I_{-s}=V_{-s}$' at the analytic frequency $f_{-s}$ selected in step 209 can be solved in the direct method. After solving the simultaneous linear equations '$Z_{-z} I_{-s}=V_{-s}$' in the direct method using the Cholesky-factorized mutual impedance by the equation shown in FIG. 3, control is passed to step 213.

Then, as described above, it is determined in step 213 whether or not the simultaneous linear equations have been solved at up to the lowest analytic frequency in the selecting process in step 209. If it is determined that they have not been solved up to that point, then control is returned to step 209. If it is determined that they have been solved up to that point, then the entire process terminates.

When the process has been performed through step 214 during the analyzing process in the iterative method in step 210, the simultaneous linear equations at the analytic frequency selected in step 209 are transformed using the factorized matrix C obtained in step 214.

Figure 18:
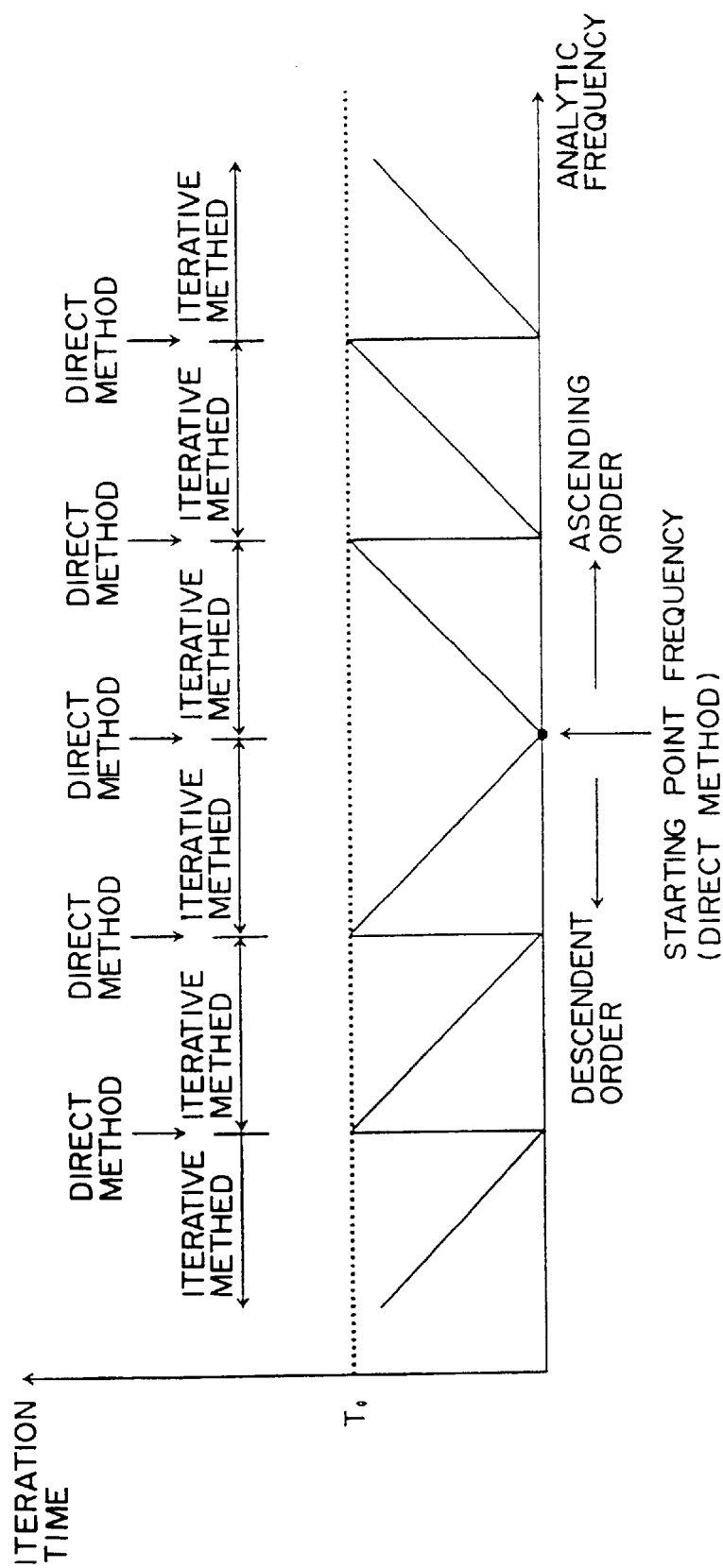
FIG. 18 shows the relationship between the time (iteration time) required by performing the program for solving the simultaneous linear equations in the flowchart shown in FIGS. 16 and 17 and the analytic frequency.

Thus, when the process flow is followed as shown in FIGS. 16 and 17, the simultaneous linear equations solution program 24 first solves the simultaneous linear equations in the direct method as shown in FIG. 18 on the analytic frequency preferably positioned in about the center of the analytic frequencies, then transforms the simultaneous linear equations using the factorized matrix obtained in the direct method while selecting the analytic frequencies in the ascending or descending order starting with the above described analytic frequency, and then solves the simultaneous linear equations in the iterative method. If the analyzing process in the iterative method indicates a frequency distance deviating farther than the analytic frequency in the direct method, and it is detected that the iterative method requires a longer computation time, then the iterative method is immediately suspended, and the simultaneous linear equations are solved in the direct method. Then, the simultaneous linear equations are transformed using the factorized matrix obtained in the direct method, and are then solved in the iterative method.

With the process configuration, the amount of computations can be prevented from largely increasing by unconditionally performing the iterative method, thereby computing at a high speed electric currents flowing through each element of an electronic appliance.

In the process flow shown in FIGS. 16 and 17, the analyzing process in the iterative method is immediately suspended when it is determined that the iterative method cannot be continued. However, considering that a solution can be obtained after a little more time if the method is not suspended, it can be designed such that the analyzing process in the iterative method is to be completed, and the simultaneous linear equations at the subsequent analytic frequency are solved in the direct method.

Figure 19:
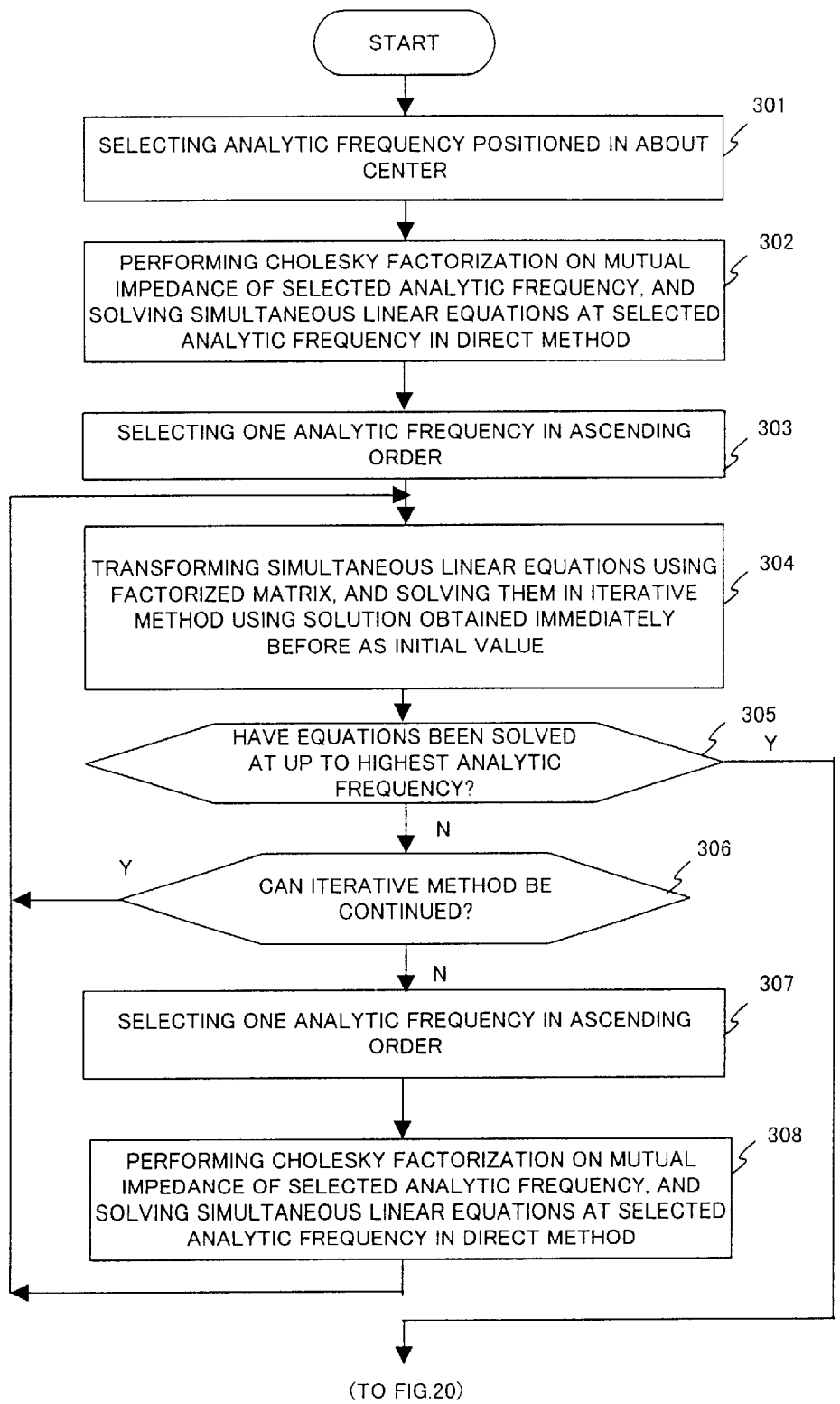
FIG. 19 is a flowchart (1) of the contents of the processes performed by the program for solving the simultaneous linear equations according to the third embodiment of the present invention.

FIGS. 19 and 20 show embodiments of the process flow according to the third embodiment of the present invention with the above described process configuration.

According to the process flow, the simultaneous linear equations solution program 24 selects an analytic frequency preferably positioned in about the center of the analytic frequencies stored in the simultaneous linear equations storage file 23 in step 301 when a request to compute the electric current flowing through each element of an electronic appliance to be simulated is issued.

Then, in step 302, the mutual impedance $Z_o$ of the selected analytic frequency is read from the simultaneous linear equations storage file 23, and is processed by the Cholesky factorization ($Z_o=CC^t$) into the form as shown in FIG. 2. Using the Cholesky-factorized mutual impedance $Z_o$, the simultaneous linear equations '$Z_o I_o=V_o$' at the selected analytic frequency are solved in the direct method by the equation shown in FIG. 3.

Then, in step 303, an analytic frequency $f_s$ (s=1, 2, 3, ... ) is selected in the ascending order from the analytic frequencies stored in the simultaneous linear equations storage file 23 starting with the analytic frequency selected in step 301. Then, in step 304, the simultaneous linear equations '$Z_s I_s=V_s$' at the analytic frequency fs selected in step 303 using the factorized matrix C obtained in step 302 are transformed into '$C^{-1}Z_s C^{t*-1}C^t I_s=C^{-1}V_s$', and are then solved in the iterative method with the solution $I_{-1}$ obtained at the analytic frequency $f_{s-1}$ immediately before the selected analytic frequency used as an initial value of $I_s$.

Then, in step 305, it is determined whether or not the simultaneous linear equations have been solved at up to the highest analytic frequency in the selecting process in step 303. If it is determined that they have been solved up to that point, then control is passed to step 309 (process flow shown in FIG. 20). If it is determined that they have not been solved, control is passed to step 306, and it is determined in the above described method whether or not the iterative method can be continued based on the analysis time and the number of iterative process in the iterative method required in step 304.

If it is determined in the determining process in step 306 that the iterative method can be continued, then control is returned to step 303. If it is determined that the iterative method cannot be continued, then control is passed to step 307, and the subsequent analytic frequency $f_{s+1}$ is selected in the ascending order.

Then, in step 308, the mutual impedance $Z_{s+1}$ of the selected analytic frequency $f_{s+1}$ is read from the simultaneous linear equations storage file 23, and is processed by the Cholesky factorization ($Z_{s+1}=CC^t$) into the form as shown in FIG. 2. Using the Cholesky-factorized mutual impedance $Z_o$, the simultaneous linear equations '$Z_{s+1} I_{s+1}=V_{s+1}$' at the selected analytic frequency are solved in the direct method by the equation shown in FIG. 3, and then control is returned to step 303.

When the process has been performed through step 308 during the analyzing process in the iterative method in step 304, the simultaneous linear equations at the analytic frequency selected in step 303 are transformed using the factorized matrix C obtained in step 308.

On the other hand, if it is determined in step 305 that the simultaneous linear equations have been solved at up to the highest analytic frequency, control is passed to step 309 (process flow shown in FIG. 20), and an analytic frequency $f_{-s}$ (s=1, 2, 3, ... ) is selected in the descending order from the analytic frequencies stored in the simultaneous linear equations storage file 23 starting with the analytic frequency selected in step 301.

Then, in step 310, the simultaneous linear equations '$Z_{-s} I_{-s}=V_{-s}$' at the analytic frequency $f_{-s}$ selected in step 309 using the factorized matrix C obtained in step 302 are transformed into '$C^{-1}Z_{-s}C^{t*-1}C^t I_{-s}=C^{-1}V_{-s}$', and are then solved in the iterative method with the solution $I_{-s+1}$ obtained at the analytic frequency $f_{-s+1}$ immediately before the selected analytic frequency used as an initial value of $I_{-s}$.

Then, in step 311, it is determined whether or not the simultaneous linear equations have been solved at up to the lowest analytic frequency in the selecting process in step 309. If it is determined that they have been solved up to that point, then the entire process terminates. If it is determined that they have not been solved, control is passed to step 312, and it is determined in the above described method whether or not the iterative method can be continued based on the analysis time and the number of iterative process in the iterative method required in step 310.

If it is determined in the determining process in step 312 that the iterative method can be continued, then control is returned to step 309. If it is determined that the iterative method cannot be continued, then control is passed to step 313, and the subsequent analytic frequency $f_{-s-1}$ is selected in the descending order.

Then, in step 314, the mutual impedance $Z_{-s-1}$ of the selected analytic frequency $f_{-s-1}$ is read from the simultaneous linear equations storage file 23, and is processed by the Cholesky factorization ($Z_{-s-1}=CC^t$) into the form as shown in FIG. 2. Using the Cholesky-factorized mutual impedance $Z_{-s-1}$ the simultaneous linear equations '$Z_{-s-1} I_{-s-1}=V_{-s-1}$' at the selected analytic frequency are solved in the direct method by the equation shown in FIG. 3, and then control is returned to step 309.

When the process has been performed through step 314 during the analyzing process in the iterative method in step 310, the simultaneous linear equations at the analytic frequency selected in step 309 are transformed using the factorized matrix C obtained in step 314.

Thus, when the process flow is followed as shown in FIGS. 19 and 20, the simultaneous linear equations solution program 24 first solves the simultaneous linear equations in the direct method on the analytic frequency preferably positioned in about the center of the analytic frequencies, then transforms the simultaneous linear equations using the factorized matrix obtained in the direct method while selecting the analytic frequencies in the ascending or descending order starting with the above described analytic frequency, and then solves the simultaneous linear equations in the iterative method. If the analyzing process in the iterative method indicates a frequency distance deviating farther than the analytic frequency in the direct method when the equations are solved in the iterative method, and it is detected that the iterative method requires a longer computation time, then the simultaneous linear equations at the subsequent analytic frequency are solved in the direct method. Then, the simultaneous linear equations are transformed using the factorized matrix obtained in the direct method, and are then solved in the iterative method.

Described below is the fourth embodiment of the present invention realized by the simultaneous linear equations solution program 24.

Figure 21:
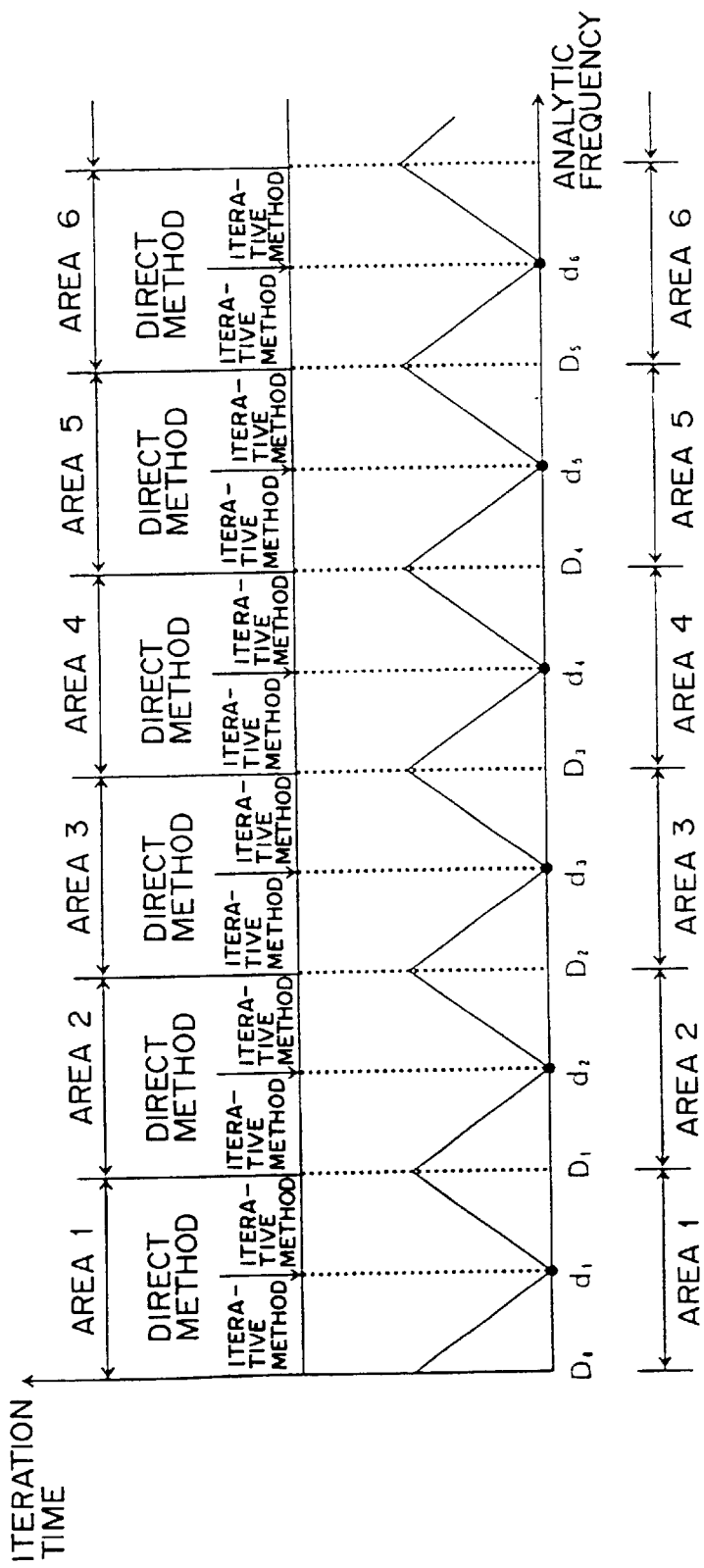
FIG. 21 shows the relationship between the time (iteration time) required to perform the iterative method when a solution is obtained by executing the program for solving the simultaneous linear equations according to the fourth embodiment of the present invention and the analytic frequency.

According to the fourth embodiment of the present invention, the simultaneous linear equations solution program 24 divides the area of an analytic frequency into a plurality of divided areas, and the analyzing process is performed according to the process flow shown in FIG. 14 on each of the divided areas as shown in FIG. 21, thereby quickly computing the electric current flowing through each element of an electronic appliance.

FIG. 22 shows an embodiment of the process flow performed by the simultaneous linear equations solution program 24 to realize the fourth embodiment of the present invention.

According to the process flow, the simultaneous linear equations solution program 24 first divides the area of an analytic frequency into a plurality of divided areas as shown in FIG. 21 in step 401. The dividing mode is described below.

Then, in step 402, a divided area is selected from among unprocessed divided areas. In step 403, it is determined whether or not all divided areas have been selected. If it is determined that all divided areas have been selected, the entire process terminates.

If it is determined in step 403 that all divided areas have not been selected, that is, if it is determined that an unprocessed divided area can be selected in step 402, then control is passed to step 404, and a simulating process is performed according to the process flow shown in FIG. 14 with the selected divided area defined as a process target. Then, control is returned to step 402 to perform an analyzing process on the unprocessed divided area.

The basic technological concept of the fourth embodiment resides in dividing the area of an analytic frequency into a plurality of divided areas. Therefore, the starting analytic frequency (analytic frequency solved in the direct method) to be selected in the process flow shown in FIG. 14 can be selected from between the analytic frequencies at both ends of each divided area. It is obviously desired to select an analytic frequency positioned in about the center of each divided area.

Thus, the simultaneous linear equations solution program 24 divides the area of an analytic frequency into a plurality of divided areas, and the analyzing process is performed according to the process flow shown in FIG. 14 on each of the divided areas, thereby quickly computing the electric current flowing through each element of an electronic appliance.

It is possible to combine the above described embodiment with any of the embodiments described above according to the process flow shown in FIGS. 16 and 17, and FIGS. 19 and 20. That is, when each divided area is processed in the iterative method according to the fourth embodiment, the direct method is used when it takes a long computation time, and then the simultaneous linear equations are transformed using a factorized matrix obtained as a result of the direct method, and then solved in the iterative method.

As shown in the process flow shown in FIG. 22, the analyzing process performed according to the process flow shown in FIG. 14 on each divided area is independent, and the processes in step 404 can be performed in parallel using a plurality of processors. With the configuration for the parallel process, a simulating process can be performed at a very high speed.

The process of dividing an analytic frequency according to the fourth embodiment, it is desired that the area of an analytic frequency can be divided such that the total computation time can be shortest. Described below is the algorithm for realizing the dividing process.

The computation time (number of times of the iterative process) is approximately proportional to the frequency distance from the starting analytic frequency from which the analysis starts in the direct method. That is, the computation time t in the iterative method at the analytic frequency distant by n from the starting analytic frequency is expressed by the following equation.

$$t = a \times n + b$$

Therefore, the total computation time T is expressed as follows.

$$T(K, D_1, \ldots D_{K-1}, d_1, \ldots, d_K) = KA + (N-K)b +$$
$$\sum_{k=d_1-1}^{D_0} a(d_1 - k) + \sum_{k=d_1+1}^{D_1-1} a(k - d_1) +$$
$$\ldots + \sum_{k=d_K-1}^{D_K-1} a(d_K - K) + \sum_{k=d_K+1}^{D_K-1} a(k - d_K)$$
$$= KA + (N-K)b +$$
$$ad_1(d_1 + 1)/2 +$$
$$a(D_1 - d_1 - 1)(D_1 - d_1)/2 +$$
$$\ldots + a(d_k - D_{K-1})(d_k - D_{K-1} + 1)/2 +$$
$$a(N - d_k - 1)(D_1 - d_K)/2$$

where: A indicates the computation time in the direct method, 0 through N indicate the areas of an analytic frequency, the interval of an analytic frequency is assumed to be 1 in the iterative method, K indicates the number of divided areas of an analytic frequency to be divided, $D_{k-1}$ through $D_k$ ($D_0=0$, $D_K=N$) indicate the k-th divided area, $d_1$ through $d_k$ indicate the starting analytic frequency (analytic frequency to be solved in the direct method) in each divided area.

The optimum starting frequency and area division can be obtained by 'K, $D_1$, . . . $D_{K-1}$, $d_1$, . . . $d_K$' requiring the shortest total computation time T.

This problem can be rewritten to $$x_k = d_k - D_{k-1}, \ y_k = D_k - d_k, \ k = 1 \text{ through } K$$

Then, it refers to the problem of obtaining an integer K, $x_k$, $y_k$ (k=1 through K) requiring the shortest total computation time T expressed as follows $$\sum_{k=1}^{K} x_k + y_k = N \quad x_k \geq 0, y_k \geq 1$$

under the following condition $$T(K, x_1, \ldots x_k, y_1, \ldots y_k) = (A-b)K + bN + (a/2)\sum_{k=1}^{K} x_k^2 + y_k^2 + x_k - y_k$$

To solve the problem, K is first fixed, and the extreme of the total computation time T is computed as follows with $x_k$, $y_k$ (k=1 through K) is assumed to be approximately continuous values.

$$x_{ok} = (N-K)/2K, y_{ok} = (N+K)/2K \quad k = 1 \sim K$$

$$T_o(K) = T(K, x_{o1}, \ldots x_{ok}, y_{o1}, \ldots, y_{ok})$$

$$= (A - (a/4) - b)K + (an^2/4K) + bN$$

The above described equation indicates that $x_{ok}$, $y_{ok}$ does not exist at k at the extreme.

This indicates that the area of the analytic frequency is required to be divided into divided areas of an equal size, and that it is necessary to use the central point of each divided area as the starting analytic frequency of each divided area (analytic frequency to be solved in the direct method).

When the extreme of To (K) is computed with K assumed as a continuous value, the following equation can be prepared.

$$K_0 = N[a/(4A-a-4b)]^{1/2}$$

$$T_0 = T_0(K_0) = N[(a(4A-a-4b)^{1/2}2+b]$$

As described above, when the computation time A in the direct method and the characteristic coefficients a and b of the computation time t in the iterative method are given, or when they can be obtained in an actual analyzing process (the characteristic coefficients a and b of the computation time t in the iterative method can be obtained with the analyzing process performed a little further), the following computation can be made.

$$K_0 = N[a/(4A-a-4b)]^{1/2}$$

Thus, the integer K close to $K_0$ is obtained. Based on the obtained values, the analytic frequency is equally divided into K, and the direct method is performed at the central point of each divided area, thereby minimizing the total computation time T.

When '(4A–a–4b)<0', the iterative method is not used, but only the direct method is used. In addition, when the area cannot be divided into divided areas of an equal size, it is desired to have a broad high frequency area from experience based on the experiment results up to now. If a central point cannot be correctly set, it is desired to set a point on the low frequency side next to the central point from experience based on the experiment results up to now.

Described below are the experiment results obtained to verify the effectiveness of the present invention.

The experiment is conducted on a square printed circuit board formed by a power supply layer and a grounding layer with 40 analytic frequency points set at 20 MHz intervals between 220 MHz and 1000 MHz. The number of dimensions of a mutual impedance matrix is 1733.

Figure 23:
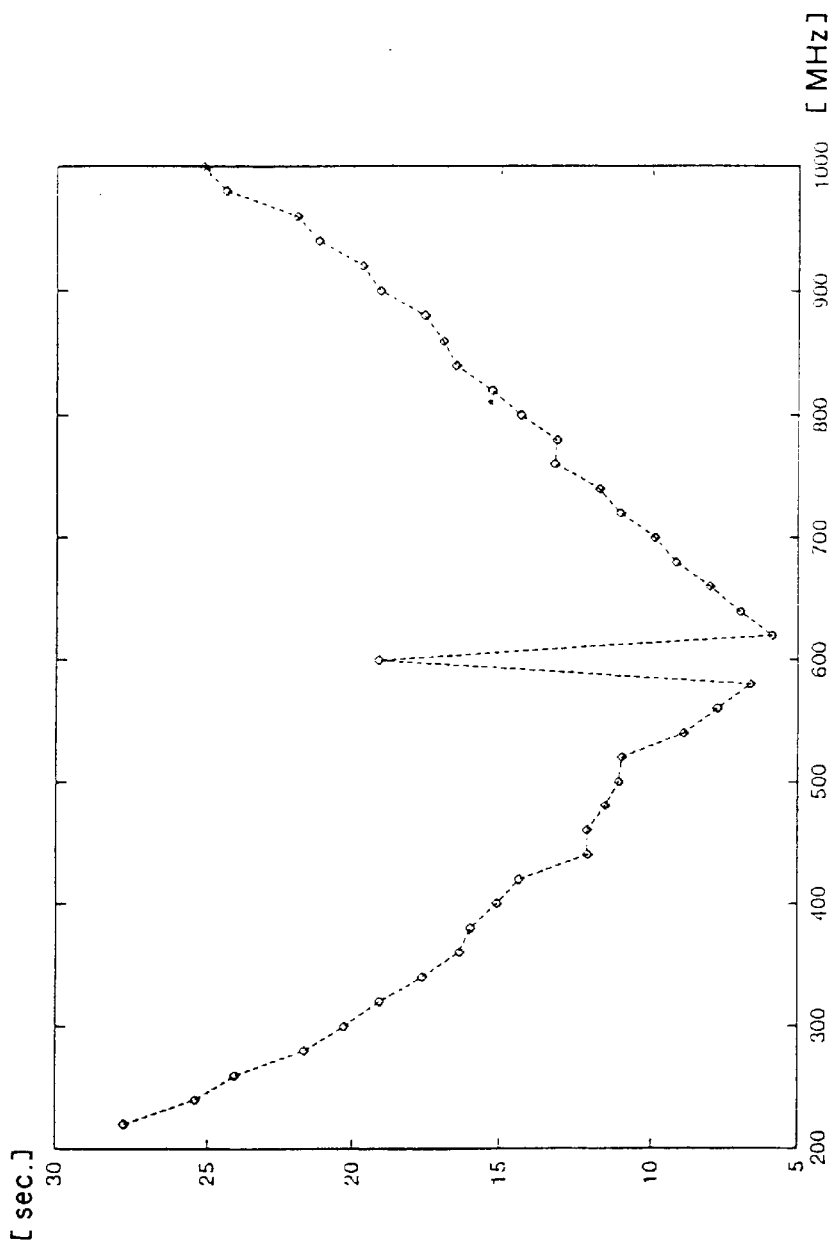
FIG. 23 is a graph showing the result of the experiment conducted by executing the program for solving the simultaneous linear equations according to the first embodiment of the present invention as shown in the flowchart in FIG. 14.

FIG. 23 shows the experiment result obtained when the process flow shown in FIG. 14 is followed.

In this experiment, the starting analytic frequency is 600 MHz. In the experiment, it takes 764.2 seconds (19.11 seconds per frequency) to solve all 40 analytic frequency points in the direct method. If the process flow according to the present invention takes only 619.32 seconds.

Furthermore, in this experiment, the computation time taken to obtain a solution in the iterative method is approximately proportional to the frequency distance from the starting analytic frequency analyzed in the direct method, thereby requiring a shorter time than the conventional technology in which the starting analytic frequency is the lowest frequency.

From the experiment result shown in FIG. 23, the computation time A in the direct method and the characteristic coefficients a and b of the computation time t in the iterative method can be expressed as follows.

$$A=19.11, a=1.143, b=4.957$$

Therefore, by the above described equation, the optimum divider K can be expressed as follows.

$$K=N[a/(4A-a-4b)]^{1/2}=5.744\approx6$$

Figure 24:
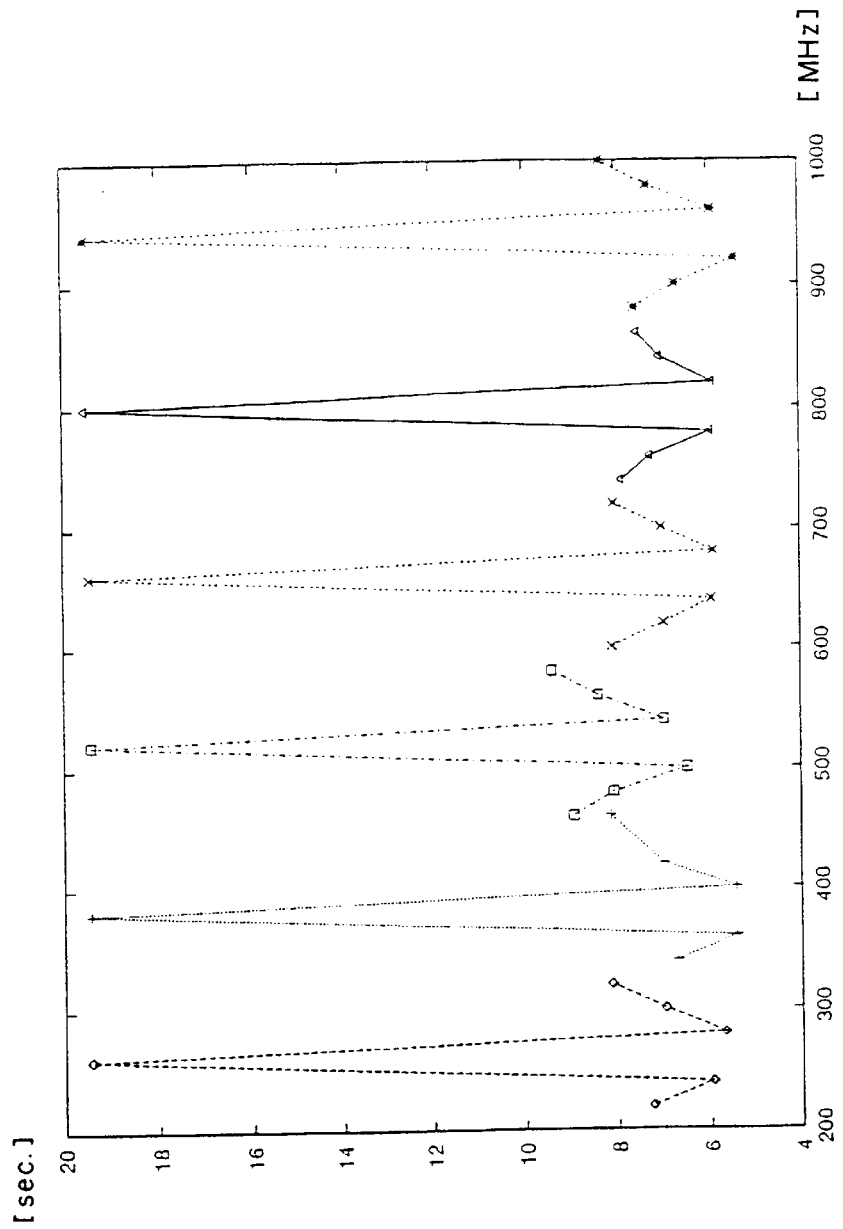
FIG. 24 shows the result of the experiment conducted by executing the program for solving the simultaneous linear equations according to the fourth embodiment as shown in the flowchart in FIG. 22 based on the result of the experiment shown in FIG. 23.

Therefore, the area can be divided as follows, and the experiment according to the process flow shown in FIG. 22 is conducted. FIG. 24 shows the experiment result.

| | |
|---|---|
| area 1: | 220–320 MHs (6 frequencies) starting point 260 MHz |
| area 2: | 340–440 MHs (6 frequencies) starting point 380 MHz |
| area 3: | 460–580 MHs (7 frequencies) starting point 520 MHz |
| area 4: | 600–720 MHs (7 frequencies) starting point 660 MHz |
| area 5: | 740–860 MHs (7 frequencies) starting point 880 MHz |
| area 6: | 880–1000 MHs (7 frequencies) starting point 940 MHz |

The following result is obtained from the experiment. Solving all 40 analytic frequencies in the direct method takes 764.2 seconds (19.11 seconds per frequency) while the fourth embodiment of the present invention takes 357.07 seconds according to the process flow shown in FIG. 22. Thus, the effectiveness of the fourth embodiment of the present invention can be proved.

The present invention has been described above by referring to the embodiment shown in the attached drawings. However, the present invention is not limited to the above described applications. For example, the present invention has described by referring to a practical example of applying it to the moment method. However, the present invention can be applied to other analyzing methods such as the finite element method, the difference method, etc.

In addition, according to the present embodiment, the Cholesky factorization has been used as a method of solving simultaneous linear equations in the direct method, but other methods can be adopted in the direct method. For example, if the amended Cholesky factorization, in which the coefficient matrix A of the simultaneous linear equations shown in FIG. 1 is factorized as $A=LDL^T$, as shown in FIG. 25 is adopted in the direct method, then the computation for obtaining a square root is not required and therefore the analyzing process can be performed at a high speed.

Furthermore, as it is obvious by referring to FIG. 8, the internal configuration of the electromagnetic field intensity computation device 20 according to the present invention is not much different from the configuration of a common computer. Therefore, the function of the electromagnetic field intensity computation device 20 can be realized in a computer. To attain this, a storage medium storing each program shown in FIG. 7 is read by a computer and each program is loaded onto the main memory so that the central processing device of the computer can execute the loaded program.

Figure 26:
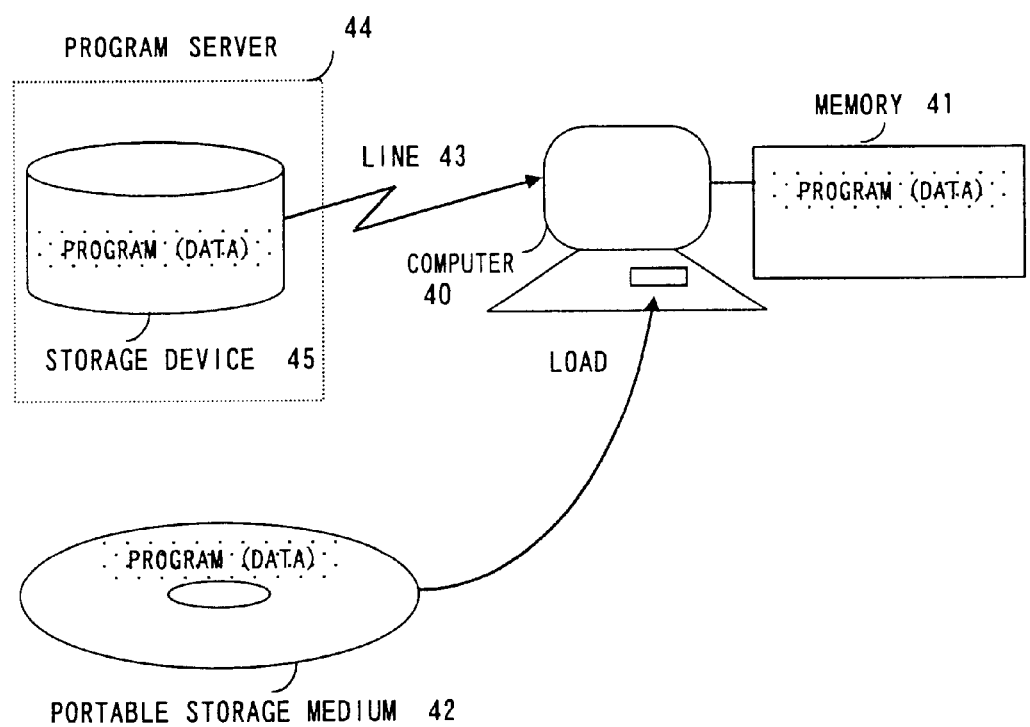
FIG. 26 shows an example of a computer-readable storage medium for reading a stored program.

FIG. 26 shows an example of a computer-readable storage medium from which a computer reads a program. The storage medium can be, for example, any of memory 41 built-in or externally provided for the mainframe of a computer 40 such as semiconductor memory, a hard disk device, etc., a portable storage medium 42 such as CD-ROM, a floppy disk, an MO (magneto-optical disk), DVD-ROM, etc., a storage device 45 of a program server 44 which is connected to the computer 40 through a line 43, and with which the computer 40 can receive a program.

As described above, the simulation device according to the present invention solves the simultaneous linear equations in the direct method using a frequency other than the frequencies on both ends of an analytic frequency area as an analysis target, and solves the simultaneous linear equations in the iterative method while transforming the simultaneous linear equations using the coefficient matrix analyzed in the direct method on the frequencies other than the above described frequency defined as the analysis target. Thus, the frequency distance between the frequency in the iterative method and the frequency in the direct method becomes shorter than in the conventional technology. Therefore, the simultaneous linear equations in the iterative method can be transformed into a form close to a desired form, thereby performing a high-speed analyzing process.

The simulation device according to the present invention divides the area of an analytic frequency, solves the simultaneous linear equations in the direct method using a frequency as an analysis target in each of the divided areas of the analytic frequency, and solves the simultaneous linear equations in the iterative method while transforming the simultaneous linear equations using the coefficient matrix analyzed in the direct method on the frequencies other than the above described frequency defined as the analysis target. Thus, the frequency distance between the frequency in the iterative method and the frequency in the direct method becomes shorter than in the conventional technology. Therefore, the simultaneous linear equations in the iterative method can be transformed into a form close to a desired form, thereby performing a high-speed analyzing process.

Thus, when simultaneous linear equations are solved in the iterative method while being transformed using a coefficient matrix analyzed in the direct method, the simulation device according to the present invention performs the direct method if the frequency distance between the frequency analyzed in the iterative method and the frequency analyzed in the direct method becomes longer and, as a result, if the analysis time in the iterative method using the coefficient matrix is long. Accordingly, a coefficient matrix analyzed in the format applicable to the analytic frequency is obtained. Using the coefficient matrix, simultaneous linear equations are solved in the iterative method. Therefore, since the simultaneous linear equations solved in the iterative method can be transformed in a desired form, thereby performing a high-speed analyzing process.

Thus, in the simulation device according to the present invention, a method of simulating an electric current can be performed at a high speed with the configuration in which an electric current flowing through electronic appliances is simulated by solving the simultaneous linear equations defined depending on the analytic frequency in the moment method, etc.

What is claimed is:

1. An apparatus for simulating an electric current flowing through an electronic appliance by solving a plurality of simultaneous linear equation sets, each defined depending on one of a set of analytic frequencies, comprising:

a selection unit selecting an analytic frequency from a frequency area to which the analytic frequency belongs excluding frequencies on both ends of the analytic frequency area;

a first analysis unit to perform Cholesky factorization on a coefficient matrix of an initial simultaneous linear equation set defined depending on the analytic frequency selected by said selection unit into a prescribed format, and to solve the initial simultaneous linear equation set in a direct method by obtaining a factorization result; and a second analysis unit performing an analysis by sequentially selecting subsequent analytic frequencies in one of an ascending and descending order starting from the analytic frequency selected by said selection unit, transforming another simultaneous linear equation set, different from the initial simultaneous linear equation set, defined depending on a next sequentially selected analytic frequency using the factorization result obtained by said first analysis unit, and solving the transformed simultaneous linear equation set using an iterative method to obtain a simulation result of the current flowing through the electronic appliance.

2. The apparatus according to claim 1, wherein said selection unit selects a frequency approximately in a center of an area to which the analytic frequency belongs as the analytic frequency.

3. The apparatus according to claim 1, wherein said second analysis unit uses a solution of a preceding simultaneous linear equation set defined by another analytic frequency obtained immediately before as an initial value used when the transformed simultaneous linear equation set is solved in the iterative method.

4. An apparatus for simulating an electric current flowing through an electronic appliance by solving a plurality of simultaneous linear equation sets, each defined depending on one of a set of analytic frequencies, comprising:

a division unit dividing an area to which the analytic frequencies belong into a plurality of areas;

a selection unit selecting one analytic frequency from each analytic frequency area divided by said division unit;

a first analysis unit to perform Cholesky factorization on a coefficient matrix of an initial simultaneous linear equation set defined depending on the analytic frequency selected by said selection unit into a prescribed format, and to solve the initial simultaneous linear equation set in a direct method by obtaining a factorization result; and a second analysis unit performing an analysis by selecting a subsequent analytic frequency from each of the analytic frequency areas divided by said division unit, transforming another simultaneous linear equation set, different from the initial simultaneous linear equation set, defined depending on the subsequent analytic frequency using the factorization result obtained by said first analysis unit, and solving the transformed simultaneous linear equation set using an iterative method to obtain a simulation result of the current flowing through the electronic appliance.

5. The apparatus according to claim 4, wherein said selection unit selects the analytic frequency from each of the analytic frequency areas divided by said division unit excluding frequencies on both ends of the analytic frequency area; and wherein said second analysis unit sequentially selects the subsequent analytic frequency in an ascending or descending order starting with the analytic frequency previously selected by said selection unit.

6. The apparatus according to claim 5, wherein said selection unit selects a frequency approximately in a center of each of the analytic frequency areas divided by said division unit as the analytic frequency.

7. The apparatus according to claim 4, wherein said second analysis unit uses a solution of a preceding simultaneous linear equation set defined by another analytic frequency obtained immediately before as an initial value used when the transformed simultaneous linear equation set is solved in the iterative method.

8. The apparatus according to claim 4, wherein said division unit divides the area to which the analytic frequency belongs such that a time required by said first and second analysis units to completely solve the simultaneous linear equation set defined for each analytic frequency can be shortest.

9. The apparatus according to claim 4, wherein a plurality of first analysis units and second analysis units are provided in the apparatus, and wherein said first analysis units and said second analysis units concurrently perform an analysis on each analytic frequency area divided by said division unit.

10. An apparatus for simulating an electric current flowing through an electronic appliance by solving a plurality of simultaneous linear equation sets, each defined depending on one of a set of analytic frequencies, comprising:

a first analysis unit performing an analysis using Cholesky factorization on a coefficient matrix of a first simultaneous linear equation set defined depending on a specified analytic frequency into a prescribed format, and solving the first simultaneous linear equation set in a direct method using a factorization result obtained by the Cholesky factorization;

a second analysis unit performing an analysis by sequentially selecting a subsequent analytic frequency in one of an ascending and descending order starting with the specified analytic frequency, transforming a second simultaneous linear equation set defined by the subsequent analytic frequency using the factorization result from said first analysis unit, and solving the transformed simultaneous linear equation set using an iterative method to obtain a simulation result of the current flowing trought electric appliance; and a solving method control unit to determine whether the iterative method is taking mose than a predetermined amount of time to solve the second simultaneous linear equation set while said second analysis unit is performing the analysis, stopping the analysis being performed by said second analysis unit and instructing said first analysis unit to perform the analysis on the subsequent analytic frequency if it is determined that the iterative method is taking more than the predetermined amount.

11. The apparatus according to claim 10, wherein when it is determined that the simultaneous linear equations can be more advantageously solved in the direct method, said solving method control unit discriminates the analysis being performed by said second analysis unit and immediately stops the analysis.

12. The apparatus according to claim 10, wherein when it is determined that the simultaneous linear equations can be more advantageously solved in the direct method, said solving method control unit stops the second analysis unit after completing a prescribed analyzing process performed by said second analysis unit.

13. The apparatus according to claim 10, wherein said solving method control unit makes a determination based on a frequency distance between a previous analytic frequency at which said first analysis unit has performed the analysis immediately before, and a current analytic frequency at which said second analysis unit is performing the analysis.

14. The apparatus according to claim 10, wherein said solving method control unit makes a determination based on a comparison between a determination time set based on a time required by said first analysis unit performing the analysis, and an analysis time required by said second analysis unit performing the analysis.

15. The apparatus according to claim 10, wherein said solving method control unit sets an allowable number of times of an iterative process based on a determination time set based on a time required by said first analysis unit performing the analysis, and an analysis time required in each iterative process performed when said second analysis unit solves simultaneous linear equations in the iterative method, makes the determination based on comparison between the allowable number of times of iterative process and the number of times of iterative process in the iterative method in the analysis being performed by said second analysis unit.

16. The apparatus according to claim 10, wherein said second analysis unit uses a solution of another simultaneous linear equation set defined by another analytic frequency obtained immediately before as an initial value used when the transformed simultaneous linear equation set is solved in the iterative method.

17. A method for simulating an electric current flowing through an electronic appliance by a plurality of simultaneous linear equation sets, each defined depending on one of a set of analytic frequencies, comprising:

performing an analysis using Cholesky factorization on a coefficient matrix of a first simultaneous linear equation set defined depending on a specified analytic frequency into a prescribed format, to solve the first simultaneous linear equation set in a direct method using a factorization result obtained by the Cholesky factorization;

performing an analysis by sequentially selecting a subsequent analytic frequency in one of an ascending and descending order starting with the specified analytic frequency, transforming a second simultaneous linear equation set defined by the subsequent analytic frequency using the factorization result, and solving the transformed simultaneous linear equation set using an iterative method to obtain a simulation result of the current flowing through the electronic appliance; and determining whether the iterative method is taking more than a predetermined a mount of time to solve the second simultaneous linear equation set while the analysis is being performed, stopping the analysis being performed and issuing an instruction to perform the analysis on the subsequent analytic frequency if it is determined that the iterative method is taking more than the predetermined amount of time.

18. A computer-readable storage medium storing a program to direct a computer to perform a process simulating an electric current flowing through an electronic appliance by solving a plurality of simultaneous linear equation sets, each defined depending on one of a set of analytic frequencies, said process comprising:

performing an analysis using Cholesky factorization on a coefficient matrix of a first simultaneous linear equation set defined depending on a specified analytic frequency into a prescribed format, to solve the first simultaneous linear equation set in a direct method using a factorization result obtained by the Cholesky factorization;

performing an analysis by sequentially selecting a subsequent analytic frequency in one of an ascending and descending order starting with the specified analytic frequency, transforming a second simultaneous linear equation set defined by the subsequent analytic frequency using the factorization result, and solving the transformed simultaneous linear equation set using an iterative method to obtain a simulation result of the current flowing through the electronic appliance; and determining weather the iterative method is taking more than a predetermined a mount of time to solve the second simultaneous linear equation set while the analysis is being performed, stopping the analysis being performed and issuing an instruction to perform the analysis on the subsequent analytic frequency if it is determined that the iterative method is taking more than thye predetermined amount of time.

19. An apparatus for simulating an electric current flowing through an electronic appliance by solving a plurality of simultaneous linear equation sets, each defined depending on one of a set of analytic frequencies, comprising:

a first analysis unit performing an analysis by solving a first simultaneous linear equation set defined depending on a specified analytic frequency in a direct method using Cholesky factorization;

a second analysis unit performing an analysis by sequentially selecting a subsequent analytic frequency starting from the analytic frequency specified by said first analysis unit, solving a second simultaneous linear equation set defined by the subsequent analytic frequency in an iterative method to obtain a simulation result of the current flowing through the electronic appliance; and a solving method control unit determining wheter the iterative method taking more than the predetermined amount of time in solving the second simultaneous linear equation set, and instructing said first analysis unit to perform the analysis on the second simultaneous linear equation set if it is determined that the iterative method is taking more than the predetermined amount of time.

* * * * *

UNITED STATES PATENT AND TRADEMARK OFFICE
CERTIFICATE OF CORRECTION

PATENT NO. : 6,768,976 B1
DATED : July 27, 2004
INVENTOR(S) : Katsumi Homma et al.

It is certified that error appears in the above-identified patent and that said Letters Patent is hereby corrected as shown below:

Title page,
Item [56], References Cited, OTHER PUBLICATIONS, "H. Lev–Ari," reference, "IEEE 1998" to -- IEEE 1989 --

Column 22,
Line 37, after "the" insert -- electric --

Column 23,
Lines 7 and 60, change "the current" to -- the electric current --

Column 24,
Line 3, after "amount" insert -- of time --
Line 64, after "the" insert -- electric --
Line 67, change "a mount" to -- amount --

Column 25,
Line 29, change "a mount" to -- amount --

Column 26,
Line 23, delete "wheter" insert -- whether --
Line 25, delete "in solving" insert -- to solve --

Signed and Sealed this

Twenty-eighth Day of December, 2004

JON W. DUDAS
*Director of the United States Patent and Trademark Office*